(12) United States Patent
Benkley, III

(10) Patent No.: US 12,136,008 B1
(45) Date of Patent: Nov. 5, 2024

(54) BIOMETRIC SMART CARD HAVING AN APERTURED METAL LAYER

(71) Applicant: IDEX Biometrics ASA, Oslo (NO)

(72) Inventor: Fred George Benkley, III, Middleton, MA (US)

(73) Assignee: IDEX Biometrics ASA, Oslo (NO)

( * ) Notice: Subject to any disclaimer, the term of this patent is extended or adjusted under 35 U.S.C. 154(b) by 0 days.

(21) Appl. No.: 18/302,958

(22) Filed: Apr. 19, 2023

(51) Int. Cl.
| | | |
|---|---|---|
| *G06K 19/06* | (2006.01) | |
| *G06K 19/077* | (2006.01) | |
| *H01Q 1/22* | (2006.01) | |
| *H05K 1/02* | (2006.01) | |

(52) U.S. Cl.
CPC ..... *G06K 19/07722* (2013.01); *H01Q 1/2208* (2013.01); *H05K 1/0243* (2013.01); *H05K 2201/10098* (2013.01)

(58) Field of Classification Search
CPC ....... G06K 19/07722; G06K 19/07749; G06K 19/0772; G06K 19/07773; G06K 19/07745; G06K 19/041; H01Q 1/2208; H01Q 1/2225; H05K 1/0283
USPC ................................................ 235/492, 487
See application file for complete search history.

(56) References Cited

U.S. PATENT DOCUMENTS

| | | |
|---|---|---|
| 9,390,364 B2 | 7/2016 | Finn et al. |
| 9,390,366 B1* | 7/2016 | Herslow .......... G06K 19/07769 |
| 9,812,782 B2 | 11/2017 | Finn et al. |
| 10,193,211 B2 | 1/2019 | Finn et al. |
| 10,248,902 B1 | 4/2019 | Finn et al. |
| 10,275,703 B2 | 4/2019 | Herslow et al. |
| 10,518,518 B2 | 12/2019 | Finn et al. |
| 10,599,972 B2 | 3/2020 | Finn et al. |
| 11,755,873 B1* | 9/2023 | Finn ................. G06K 19/07749 235/492 |
| 2019/0171923 A1 | 6/2019 | Finn |
| 2019/0220723 A1* | 7/2019 | Herslow .......... G06K 19/07722 |
| 2021/0073608 A1* | 3/2021 | Finn ........................ B21D 5/16 |
| 2021/0150294 A1 | 5/2021 | Finn |
| 2022/0147785 A1* | 5/2022 | Placitelli .......... G06K 19/07733 |
| 2023/0101831 A1 | 3/2023 | Light |

FOREIGN PATENT DOCUMENTS

KR 102039900 * 11/2019 ....... B32B 38/00012

OTHER PUBLICATIONS

Nternational_Search_Report_PCT/US2024/020623_ISA_US_Jul. 29, 2024.

* cited by examiner

*Primary Examiner* — Daniel St Cyr
(74) *Attorney, Agent, or Firm* — Smith Tempel Blaha LLC; Michael J. Tempel

(57) ABSTRACT

A biometric smart card includes a first polymer layer, an electrical substrate layer having at least one interconnect layer over the first polymer layer, an antenna proximate to the electrical substrate layer, a metal layer proximate to the antenna and the electrical substrate layer, the metal layer comprising a plurality of circumferential apertures, and a second polymer layer over the metal layer, wherein the plurality of apertures in the metal layer allow the smart card to flex in one, two or three dimensions.

18 Claims, 17 Drawing Sheets

BIOMETRIC SMART CARD HAVING AN APERTURED METAL LAYER

BACKGROUND

Remote biometric user authentication is becoming more and more ubiquitous as a way of verifying a user's identity and securely requesting the authorization of transactions initiated by that user and for other actions. Biometric authentication for example, fingerprint matching, can be performed using an electronic device in the user's possession e.g., a smart card. In this example, a user's identity may be verified by comparing a fingerprint sample provided by the user to a trusted biometric template of that user. A trusted biometric template may be created by, for example, obtaining and storing one or more trusted samples of a user's fingerprint (or portions of a fingerprint) in a trusted template. Subsequent fingerprint samples are compared against the trusted template to authenticate the user. The trusted template may also be referred to as a trusted biometric template or a verification template.

A smart card is typically constructed from multiple layers of material, usually plastic or plastic-like material layers and an electrical conductivity layer that are laminated together to form the card. Some higher-end smart cards also include a metal layer embedded within the multi-layer structure to give the smart card a heavier more robust feel. These cards are typically branded at a higher level that ordinary plastic smart cards.

One of the drawbacks of including a metal layer in a smart card is that the metal layer may make the smart card more rigid than may be desirable. Another drawback of a metal layer in a smart card is that in some scenarios, the metal layer may impede the wireless transfer of power and/or data to and/or from the smart card when the smart card is used at a contactless terminal.

Therefore, it is desirable to provide an improved metal layer embedded within a smart card that overcomes these drawbacks.

SUMMARY

In an exemplary embodiment, a biometric smart card includes a first polymer layer, an electrical substrate layer having at least one interconnect layer over the first polymer layer, an antenna proximate to the electrical substrate layer, a metal layer proximate to the antenna and the electrical substrate layer, the metal layer comprising a plurality of circumferential apertures, and a second polymer layer over the metal layer, wherein the plurality of apertures in the metal layer allow the smart card to flex in one, two or three dimensions.

In another exemplary embodiment, a method for eddy current mitigation in a smart card includes generating a first magnetic field in a smart card upon application of a first current, providing a metal layer in the smart card, the metal layer comprising a plurality of circumferential apertures, inducing an eddy current in the metal layer, the eddy current resulting in a second magnetic field that opposes the first magnetic field, and wherein the plurality of circumferential apertures in the metal layer reduces a negating effect of the second magnetic field on the first magnetic field by redirecting a flow of the eddy current in a vicinity of the antenna.

In another exemplary embodiment, a device for eddy current mitigation in a smart card includes means for generating a first magnetic field in a smart card upon application of a first current, means for providing a metal layer in the smart card, the metal layer comprising a plurality of circumferential apertures, means for inducing an eddy current in the metal layer, the eddy current resulting in a second magnetic field that opposes the first magnetic field, and means for reducing an effect of the second magnetic field on the first magnetic field by redirecting a flow of the eddy current in a vicinity of the antenna.

Other systems, methods, features, and advantages will be or become apparent to one with skill in the art upon examination of the following figures and detailed description. It is intended that all such additional systems, methods, features, and advantages be included within this description, be within the scope of the specification, and be protected by the accompanying claims.

BRIEF DESCRIPTION OF THE DRAWINGS

Exemplary embodiments can be better understood with reference to the following drawings. The components in the drawings are not necessarily to scale, emphasis instead being placed upon clearly illustrating the principles of the present invention.

DETAILED DESCRIPTION

Figure 1:
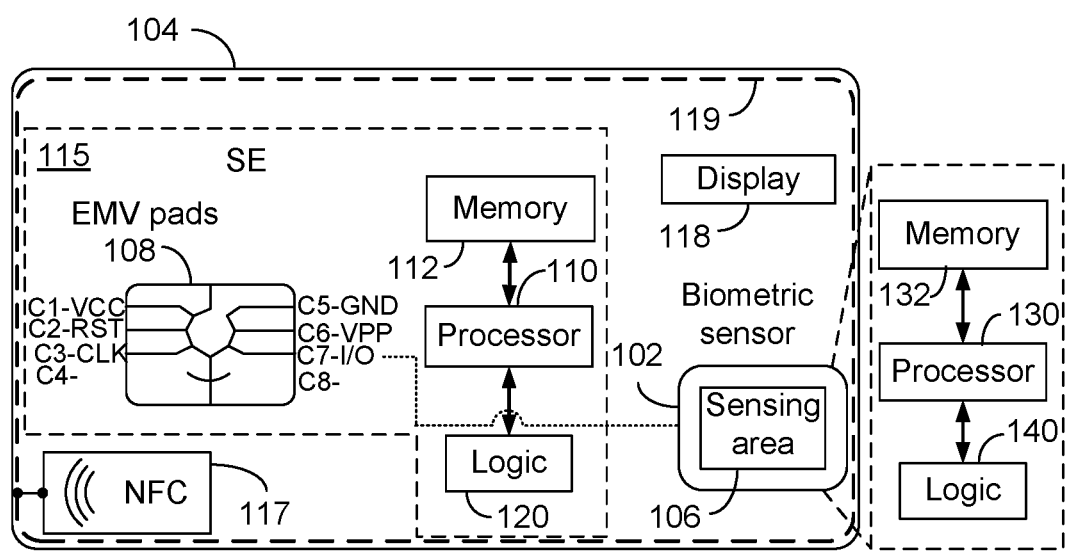
FIG. 1 illustrates a biometric smart card assembly with a biometric sensor, such as fingerprint sensor, instantiated on a smart card according to some embodiments.

While aspects of the subject matter of the present application may be embodied in a variety of forms, the following description and accompanying drawings are merely intended to disclose some of these forms as specific examples of the subject matter. Accordingly, the subject matter of this application is not intended to be limited to the forms or embodiments so described and illustrated.

Unless defined otherwise, all terms of art, notations and other technical terms or terminology used herein have the same meaning as is commonly understood by one of ordinary skill in the art to which this application belongs. All patents, applications, published applications and other publications referred to herein are incorporated by reference in their entirety. If a definition set forth in this section is contrary to or otherwise inconsistent with a definition set forth in the patents, applications, published applications, and other publications that are herein incorporated by reference, the definition set forth in this section prevails over the definition that is incorporated herein by reference.

Unless otherwise indicated or the context suggests otherwise, as used herein, "a" or "an" means "at least one" or "one or more."

This description may use relative spatial and/or orientation terms in describing the position and/or orientation of a component, apparatus, location, feature, or a portion thereof. Unless specifically stated, or otherwise dictated by the context of the description, such terms, including, without limitation, top, bottom, above, below, under, on top of, upper, lower, left of, right of, in front of, behind, next to, adjacent, between, horizontal, vertical, diagonal, longitudinal, transverse, radial, axial, etc., are used for convenience in referring to such component, apparatus, location, feature, or a portion thereof in the drawings and are not intended to be limiting.

Furthermore, unless otherwise stated, any specific dimensions mentioned in this description are merely representative of an exemplary implementation of a device embodying aspects of the application and are not intended to be limiting.

As used herein, the term "adjacent" refers to being near or adjoining. Adjacent objects can be spaced apart from one another or can be in actual or direct contact with one another. In some instances, adjacent objects can be coupled to one another or can be formed integrally with one another.

As used herein, the terms "substantially" and "substantial" refer to a considerable degree or extent. When used in conjunction with, for example, an event, circumstance, characteristic, or property, the terms can refer to instances in which the event, circumstance, characteristic, or property occurs precisely as well as instances in which the event, circumstance, characteristic, or property occurs to a close approximation, such as accounting for typical tolerance levels or variability of the embodiments described herein.

As used herein, the terms "optional" and "optionally" mean that the subsequently described, component, structure, element, event, circumstance, characteristic, property, etc. may or may not be included or occur and that the description includes instances where the component, structure, element, event, circumstance, characteristic, property, etc. is included or occurs and instances in which it is not or does not.

In an exemplary embodiment, a biometric smart card includes a flexible metal layer that allows the smart card to exhibit a robust appearance and feel, but that is also flexible.

In an exemplary embodiment, a biometric smart card includes a flexible metal layer that allows the smart card to reduce the effect of eddy currents when used at a contactless terminal.

FIG. 1 illustrates a biometric smart card (BSC) assembly with a biometric sensor, such as biometric sensor 102, installed on a user device. In an exemplary embodiment, the user device may be a smart card 104 according to some embodiments and the biometric sensor 102 may be a fingerprint sensor. In other embodiments, a user device may be a device other than a smart card, such as, for example, a wearable device, a communication device, a personal computing device, a tablet, or another user device. In the illustrated embodiment shown in FIG. 1, the smart card 104 is a limited device, as described above, and the smart card 104 comprises the biometric sensor 102. In some embodiments, the smart card 104 comprises a fingerprint, or other biometric sensor 102, processor or processing circuitry 110, memory 112, a display 118, logic 120 and contact pads 108 providing contacts for an external power source. In an exemplary embodiment, the biometric sensor 102 may also comprise processor or processing circuitry 130, memory 132 and logic 140. The contact pads 108 may be any type of input/output (I/O) interface, and as an example, may be referred to as EMV (Europay, MasterCard, Visa) pads and may be used to provide a physical connection to a POS terminal, or other host device. The processing circuitry 110 and 130 may be a microprocessor, microcontroller, microcontroller unit (MCU), application-specific integrated circuit (ASIC), field-programmable gate array (FPGA), or any combination of components configured to perform and/or control the functions of the smart card 104. The memory 112 and 132 may be a read-only memory (ROM) such as EPROM or EEPROM, flash, or any other storage component capable of storing executory programs and information for use by the processing circuitry 110 and 130. The biometric sensor 102 may comprise sensor controlling circuitry and a sensor memory. The sensor controlling circuitry may be a microprocessor, microcontroller, application-specific integrated circuit (ASIC), field-programmable gate array (FPGA), or any combination of components configured to perform and/or control the functions of the biometric sensor 102. The sensor memory may be a read-only memory (ROM) such as EPROM or EEPROM, flash, or any other storage component capable of storing executory programs and information for use by the processing circuitry 110 and 130. The sensor controlling circuitry is configured to execute fingerprint sensor application programming (i.e., firmware)

stored in the sensor memory 132. The memory 112 and the sensor memory 132 may be the same component. The sensor controlling circuitry is coupled to or may be part of the processing circuitry 110 and 130. The various components of the smart card 104 are appropriately coupled and the components may be used separately or in combination to perform the embodiments disclosed herein.

In an exemplary embodiment, the processing circuitry 110 may be connected to logic 120 and the processing circuitry 130 may be connected to logic 140. The logic 120 and 140 may comprise software, firmware, instructions, circuitry, or other devices, configured to be executed by the processing circuitry 110 and 130, respectively, to control one or more functions of the smart card 104, as described herein.

In an exemplary embodiment, the biometric sensor 102, the processor 110 and/or 130, the memory 112 and/or 132, and the logic 120 and/or the logic 140 may be configured to capture one or more submitted current biometric features corresponding to a biometric sample that may comprise one or more biometric features that form a current user identity sample provided by a user, compare the one or more current biometric sample to a previously obtained biometric sample corresponding to a previously obtained user identity sample, and if the one or more current biometric features in the biometric sample match the previously obtained biometric sample, generate an authorization signal that identifies the current user identity sample as belonging to an authorized user, the authorization signal corresponding to a user initiated successful biometric user authentication.

In another exemplary embodiment, the biometric sensor 102, the processor 110 and/or 130, the memory 112 and/or 132, and the logic 120 and/or the logic 140 may be configured to perform an enrollment process where the biometric sensor 102 collects multiple biometric samples of a user to enroll the user in the memory 112 and/or 132 of the smart card 104.

The contact pads 108 comprise one or more power transmission contacts, which may connect electrical components of the smart card 104, such as an LED, the processing circuitry 110, memory 112, display 118, sensor elements (e.g., the biometric sensor 102) etc., to an external power source. In some embodiments, the contact pads 108 further comprise one or more data transmission contacts that are distinct from the power transmission contacts which connect the smart card 104 to an external device configured to receive data from and/or transmit data to the smart card 104. In this context, the data transmission contacts of the smart card 104 are the contacts that convey data transmitted to or transmitted from the smart card 104.

In an exemplary embodiment, the display 118 may be configured to provide interactive communication with a user. For example, the display 118 may be configured to provide various information to a user. Although shown in FIG. 1 as being on a front-facing surface of the smart card 104, the display 118 may also be located on an opposite (rear-facing) surface of the smart card 104.

The processing circuitry 110, the memory 112 and the logic 120 may comprise at least part of a secure element 115. The contact pads 108 may be part of the secure element 115 which includes the processing circuitry 110, memory 112, and logic 120, all of which are in electrical communication with the contact pads 108. In an exemplary embodiment, the secure element 115 may conform to an EMVCo. power management protocol commonly used on smart cards, and the contact pads 108 provide electric contacts between the smart card 104 and a host device, such as for example, a smart phone, an enrollment sleeve, a tablet computer, an external card reader, or other host device, to provide power to the processing circuitry 110 of the card and to read data from and/or write data to the memory 112. In an exemplary embodiment, a host device, such as a smart phone, a tablet, a POS terminal, or another device, may provide temporary power to the smart card 104 using, for example, NFC technology, Qi power technology, a combination of NFC and Qi power technology, or other wireless power technology, in which case the smart card 104 includes NFC element 117 or another power element. In an exemplary embodiment, an antenna 119 may be coupled to the NFC element 117 to allow the smart card 104 to harvest NFC power from a host device, such as an NFT terminal, a POS terminal, a smart phone, a tablet, or another device. Although shown as generally occupying a periphery of the smart card 104, the antenna 119 may take other shapes and configurations. The antenna 119 may be fabricated using deposited or formed conductive materials such as copper or tin, but could also be formed using thin wires embedded into the card substrate. The antenna 119 may be fabricated using other techniques or may be fabricated on other layers, or may be fabricated on a separate layer that can be integrated into the smart card 104. The antenna 119 may comprise one or more sections or elements forming loops or conductive segments, or may have a meandering configuration.

In some embodiments, NFC capability may be implemented on the smart card 104 using NFC communication element 117 to communicate with a host device, and in some embodiments to allow a host device to provide power, or temporary power, to the smart card 104. NFC is a standards-based wireless communication technology that allows data to be exchanged between devices that are a few centimeters apart. NFC operates at a nominal frequency of 13.56 MHz and transfers data at up to 424 Kbits/seconds. In some embodiment, the NFC element 117 may be completely or partially part of, or contained within, the secure element 115 or within the biometric sensor 102.

When used for contactless transactions, NFC-enabled smart phones incorporate smart chips (called secure elements, similar to the secure element 115 on the smart card 104) that allow the smart phone to securely store and use the transaction application and consumer account information. Contactless transactions between an NFC-enabled mobile phone and a POS terminal use the standard ISO/IEC 14443 communication protocol currently used by EMV contactless credit and debit chip cards. NFC-enabled smart phones and other devices can also be used for a wide variety of other applications including chip-enabled mobile marketing (e.g., coupons, loyalty programs and other marketing offers), identity and access, ticketing and gaming. NFC is available as standard functionality in many mobile phones and allows consumers to perform safe contactless transactions, access digital content, and connect electronic devices simply. An NFC chip in a mobile device can act as a card or a reader or both, enabling consumer devices to share information and to make secure payments quickly.

In some embodiments described herein, the contact pads 108 are only used for providing connection points via the one or more power transmission contacts, such as C1 VCC and C5 GND, to an external power source, and no data is transmitted to or from the smart card 104 during an activation or enrollment process. The smart card 104 may comprise one or more power transmission contacts for connecting the smart card 104 to a power source, without any further data transmission capability as in a secure element. In other embodiments, the location of the biometric sensor 102 may be embedded into any position on the smart card 104 such that the position of the biometric sensor 102 is substantially separated from the contact pads 108 and allows a user to place a finger on the biometric sensor 102.

A user can carry out various functions on the smart card 104 by placing a finger in various positions over a sensing area 106 of the biometric sensor 102. The sensing area 106 comprises a two-dimensional array of sensor elements. Each sensor element is a discrete sensing component which may be enabled depending on the function of the biometric sensor 102. Any combination of sensor elements in the two-dimensional array may be enabled depending on the function of the biometric sensor. While the illustrated embodiment shown in FIG. 1 describes the biometric sensor 102 in relation to the smart card 104, this is not required and the biometric sensor 102, or other biometric sensor, may be incorporated in a different limited device in other embodiments. For example, other limited devices in which aspects of the technology describe herein may be incorporated include fitness monitors, wearable devices, domestic and industrial appliances, automotive components, and "Internet of things" (IOT) devices.

In some embodiments, the sensing area 106 can have different shapes including, but not limited to, a rectangle, a circle, an oval, a diamond, a rhombus, or a lozenge.

The biometric sensor 102 may comprise an array of sensor elements that can image the finger surface and fingerprint patterns using a variety of measurement technologies including but not limited to: capacitive, thermal, resistive, optical, or ultrasonic. These sensing elements may be located on an ASIC or separately on a companion substrate or hybrid.

Figure 2A:
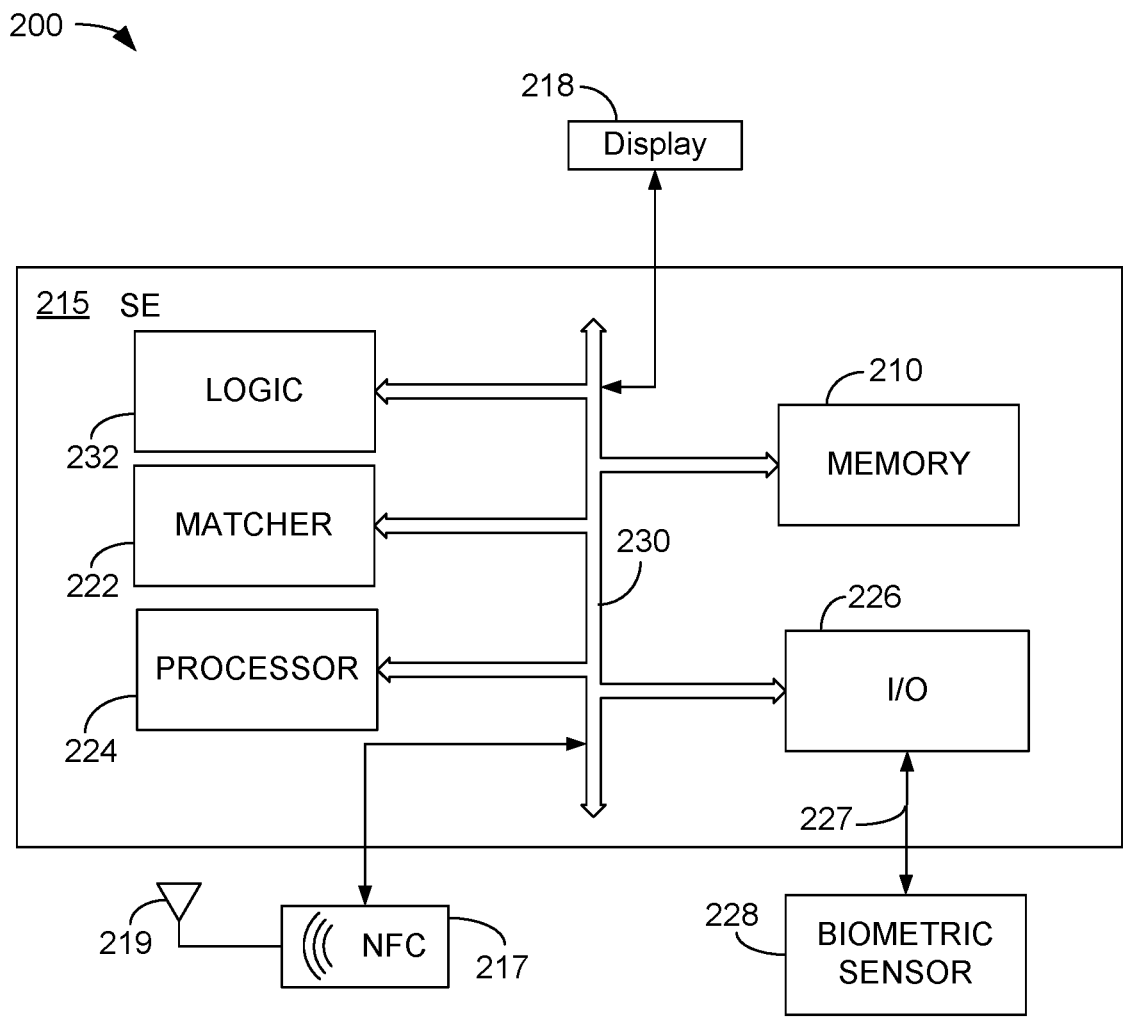
FIG. 2A illustrates a block diagram of the electronic circuitry of the biometric smart card shown in FIG. 1.

FIG. 2A is a block diagram 200 of the electronic circuitry of the biometric smart card shown in FIG. 1. In an exemplary embodiment, the portion of the smart card may comprise a secure element 215. The secure element 215 may be similar to the secure element 115 of FIG. 1. In an exemplary embodiment, the secure element 215 may comprise a processor 224, a memory 210, a matcher 222, logic 232 and an I/O element 226 operatively coupled together over a communication bus 230. A biometric sensor 228 may provide data to the I/O element 226 over encrypted or non-encrypted connection 227. In an exemplary embodiment, the biometric sensor 228 may be a fingerprint sensor, similar to the biometric sensor 102 of FIG. 1. In an exemplary embodiment, the memory 210 may be similar to the memory 112 or the memory 132 of FIG. 1.

In an exemplary embodiment, the matcher 222 may be hardware, software, firmware, or a combination thereof, and may be configured to process samples from the biometric sensor 228 to determine whether a biometric sample provided by the biometric sensor 228 has a sufficient number of correlated features with (and/or matches or partially matches) a trusted biometric sample that may be stored in the secure memory 210 to allow the determination that the new or live biometric sample provided by the biometric sensor 228 belongs to the same user as does a trusted biometric sample. In some embodiments, the matching function may reside completely in the SE or parts of the matching function may reside in both an ASIC and the SE, which in some embodiments may be combined into a single element. Biometric sample matching technology is known to those having ordinary skill in the art and will not be described in detail herein.

In an exemplary embodiment, an NFC element 217 and antenna 219 may be connected to the SE 215 to allow the smart card (not shown) that is associated with the SE 215 to harvest power wirelessly. The NFC element 217 and the antenna 219 are similar to the NFC element 117 and antenna 119 described in FIG. 1.

In an exemplary embodiment, a display 218 may be connected to the SE 215 or to another processing element outside of the SE 215, to provide a multi-function display to a user. In an exemplary embodiment, the display 218 may be similar to the display 118 described in FIG. 1. In an exemplary embodiment, the processor 224 and the NFC element 217 may be configured to determine signal strength and the display 218 may be used as a signal strength indicator to display NFC signal strength to a user.

Figure 2B:
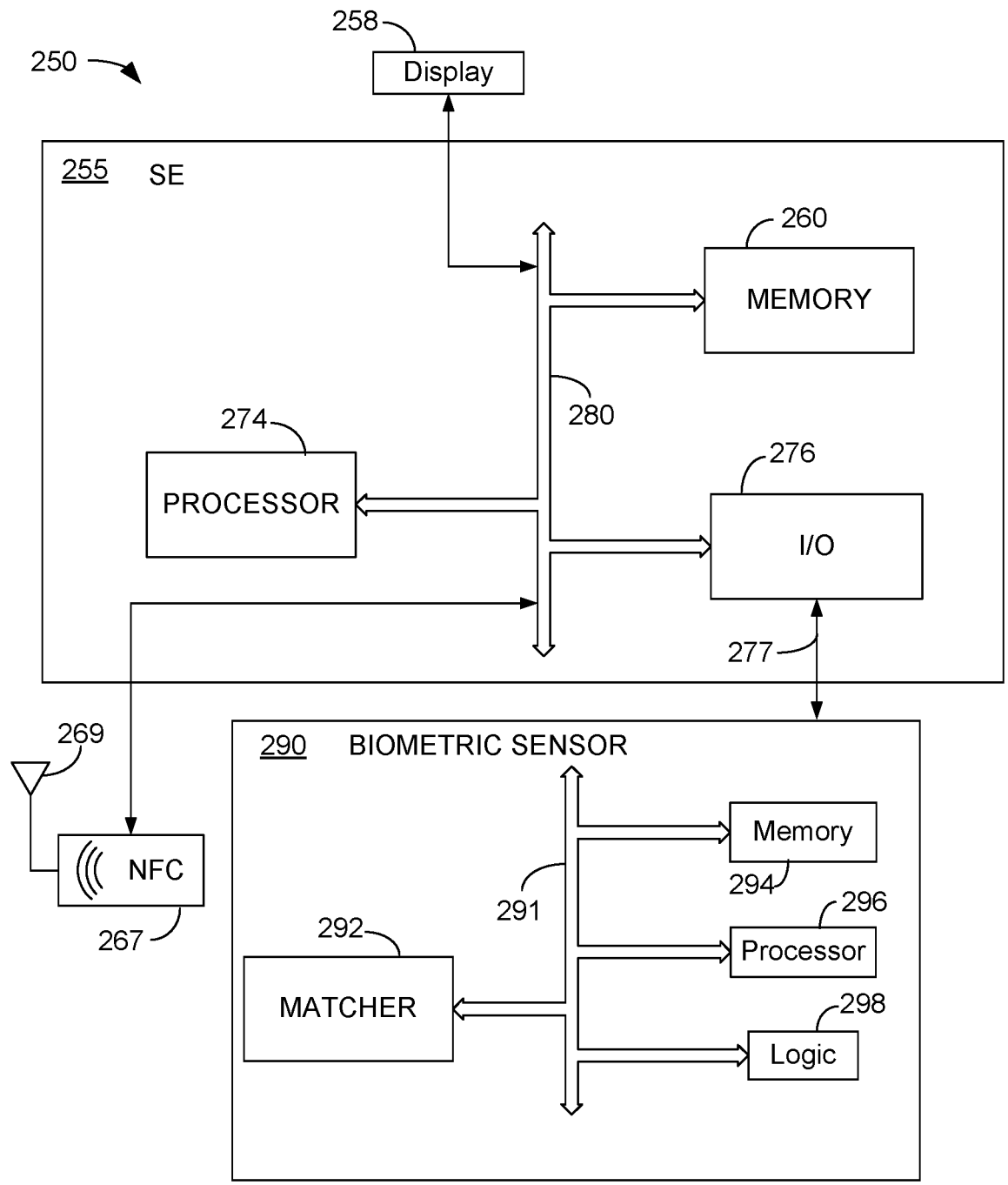
FIG. 2B illustrates an alternative exemplary embodiment of a block diagram of the electronic circuitry of the biometric smart card shown in FIG. 1.

FIG. 2B is block diagram 250 of an alternative exemplary embodiment of the electronic circuitry of the smart card shown in FIG. 1. In an exemplary embodiment, the portion of the smart card may comprise a secure element 255. The secure element 255 may be similar to the secure element 115 of FIG. 1. In an exemplary embodiment, the secure element 255 may comprise a processor 274, a memory 260 and an I/O element 276 operatively coupled together over a communication bus 280. In an exemplary embodiment, a biometric sensor 290 may include a memory 294, a processor 296, logic 298 and a matcher 292. In an exemplary embodiment, the biometric sensor 290 may provide data to the I/O element 276 over encrypted or non-encrypted connection 277. In an exemplary embodiment, the biometric sensor 290 may be a fingerprint sensor, similar to the biometric sensor 102 of FIG. 1. In an exemplary embodiment, the memory 260 may be similar to the memory 112 or the memory 132 of FIG. 1.

In an exemplary embodiment, the matcher 292 may be hardware, software, firmware, or a combination thereof, and may be configured to process samples from the biometric sensor 290 to determine whether a biometric sample provided by the biometric sensor 290 has a sufficient number of correlated features with (and/or matches or partially matches) a trusted biometric sample that may be stored in the secure memory 260 to allow the determination that the new or live biometric sample provided by the biometric sensor 290 belongs to the same user as does the trusted biometric sample.

In an exemplary embodiment, an NFC element 267 and antenna 269 may be connected to the SE 255 to allow the smart card (not shown) that is associated with the SE 255 to harvest power wirelessly. The NFC element 267 and the antenna 269 are similar to the NFC element 117 and antenna 119 described in FIG. 1.

In an exemplary embodiment, a display 258 may be connected to the SE 255 or to another processing element outside of the SE 255, to provide a multifunction display to a user. In an exemplary embodiment, the display 258 may be similar to the display 118 described in FIG. 1. In an exemplary embodiment, the processor 274 and the NFC element 267 may be configured to determine signal strength and the display 258 may be used as a signal strength indicator to display NFC signal strength to a user.

Figure 3A:
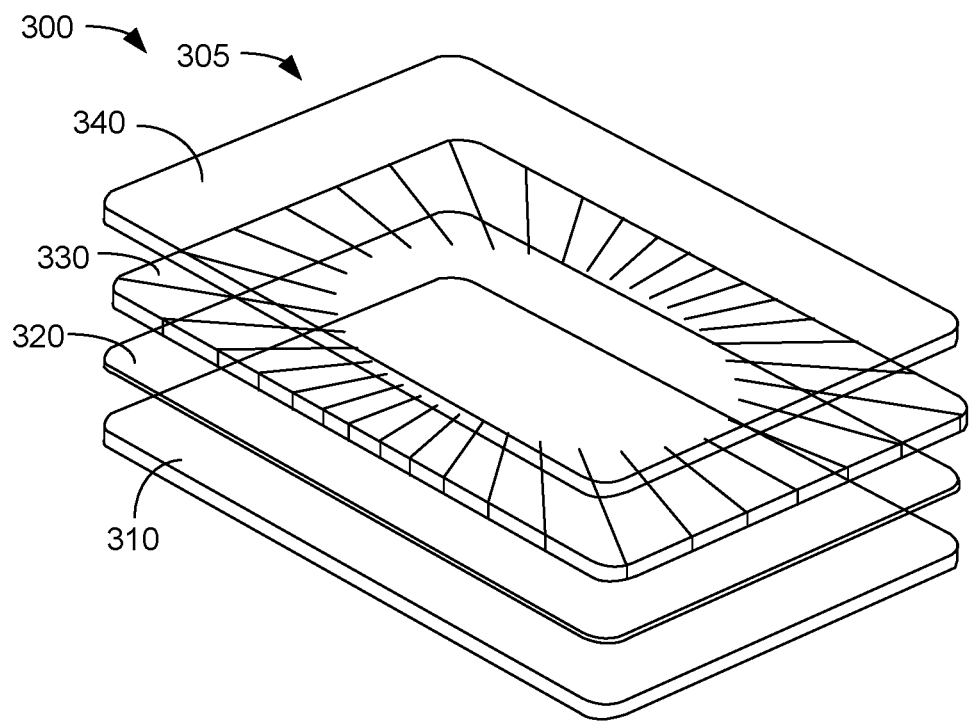
FIG. 3A is a diagram showing an exploded view of an exemplary embodiment of a biometric smart card having a metal layer in accordance with an exemplary embodiment of the disclosure.

FIG. 3A is a diagram 300 showing an exploded view of an exemplary embodiment of a biometric smart card having a metal layer in accordance with an exemplary embodiment of the disclosure. The diagram 300 shows a smart card 305 having a bottom polymer (poly) layer 310, an electrical substrate layer 320, a metal layer 330 and a top poly layer 340. In an exemplary embodiment, the electrical substrate layer 320 may comprise one or more elements, one or more circuits or circuit layers, an antenna, a substrate for an antenna formed on a different layer, etc. In some embodiments, there may be one or more adhesive layers located between one or more of the layers shown in FIG. 3A. In some embodiments, the top poly layer 340 and the bottom poly layer 310 may be fused (or hot laminated) together in one or more locations so that one or more separate adhesive layers may be eliminated.

In an exemplary embodiment, the metal layer 330 may comprise a number of apertures (or slits, slots, openings, cut outs, etc.). In some embodiments, the apertures may be referred to as circumferential apertures because they may extend from an edge, a periphery or a perimeter of the metal layer 330 inwards toward the center of the metal layer 330. Details of the circumferential apertures will be described below. In an exemplary embodiment, the metal layer 330 may be referred to as a contiguous metal layer because it is of similar dimension as the bottom poly layer 310, the electrical substrate layer 320 and the top poly layer 340.

Figure 3B:
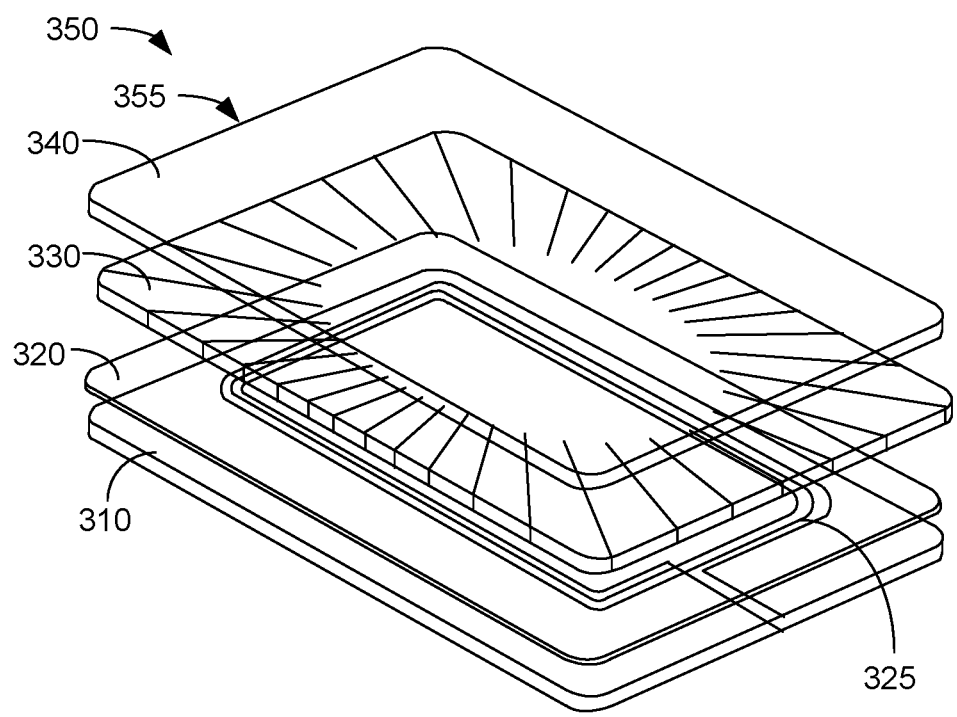
FIG. 3B is a diagram showing an exploded view of an exemplary embodiment of a biometric smart card having a metal layer in accordance with another exemplary embodiment of the disclosure.

FIG. 3B is a diagram 350 showing an exploded view of an exemplary embodiment of a biometric smart card having a metal layer in accordance with another exemplary embodiment of the disclosure. The diagram 350 shows a smart card 355 that is similar to the smart card shown in FIG. 3A. However, the diagram 350 shows that the smart card 355 includes an electrical substrate layer 320 that also can include or that can be proximate to or adjacent to an antenna 325. The antenna 325 may be similar to the antenna 119 described above in FIG. 1. In another exemplary embodiment the metal layer 330 could have additional cutouts or openings to accommodate the z-axis height of electronic components or modules mounted on the electrical substrate layer 320.

Figure 4A:
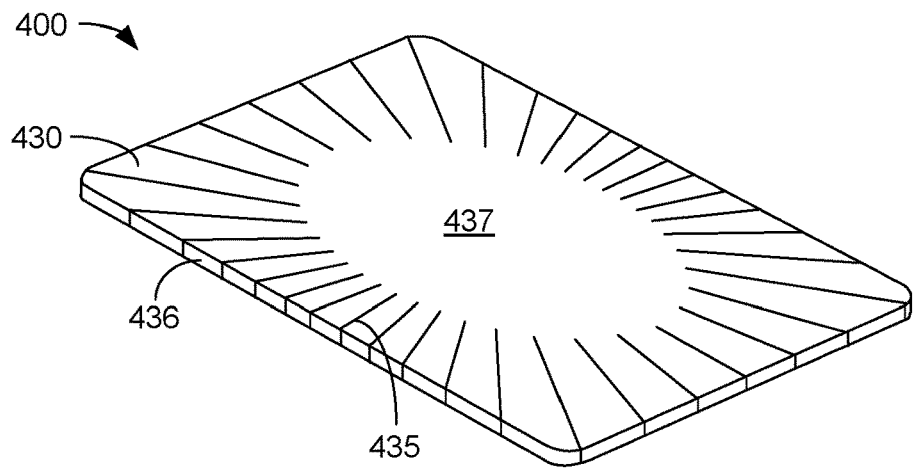
FIG. 4A is a diagram showing a circumferentially apertured metal layer of FIG. 3A or FIG. 3B in accordance with an exemplary embodiment of the disclosure.

FIG. 4A is a diagram 400 showing a circumferentially apertured metal layer of FIG. 3A or FIG. 3B in accordance with an exemplary embodiment of the disclosure. The metal layer 430 may include circumferential apertures 435. In an exemplary embodiment, the circumferential apertures 435 extend completely through a thickness of the metal layer 430 from a periphery 436 along the circumference of the metal layer 430 inward toward an interior portion or central area 437 of the metal layer 430. In an exemplary embodiment, the circumferential apertures 435 are arranged in a two-dimensional array. In an exemplary embodiment, two or more of the circumferential apertures 435 may be parallel to each other and may be of the same or differing lengths and/or widths. In other embodiments, two or more of the apertures 435 may not be parallel to each other and may be the same or differing lengths and/or widths, and/or spacings. In an exemplary embodiment, the circumferential apertures 435 each begin at an outer periphery 436 of the metal layer 430 and terminate toward the central area 437 in the approximate central portion of the metal layer 430. In an exemplary embodiment, the circumferential apertures 435 do not extend substantially completely across a length or a width the metal layer 430, thus allowing the metal layer 430 to retain mechanical stability while also allowing the metal layer 430 to flex. In an exemplary embodiment, the circumferential apertures 435 reduce the rigidity of the metal plate 430 and allow the metal layer 430 to flex, and a smart card having the metal layer 430, to easily bend in one, two or three dimensions and to conform to a shape other than flat. For example, a smart card having the metal layer 430 may fit inside a wallet and can flex to take on the shape of the wallet, thus making a smart card having the metal layer 430 flexible in one or more dimensions. Terminating the circumferential apertures 435 toward the central area 437 in the approximate central portion of the metal layer 430 provides the above-mentioned flexibility while maintaining the mechanical stability of the metal layer 430. In an exemplary embodiment, an amount of flexibility of the metal layer 430 can be controlled by selecting the dimensions of the circumferential apertures 435.

Figure 4B:
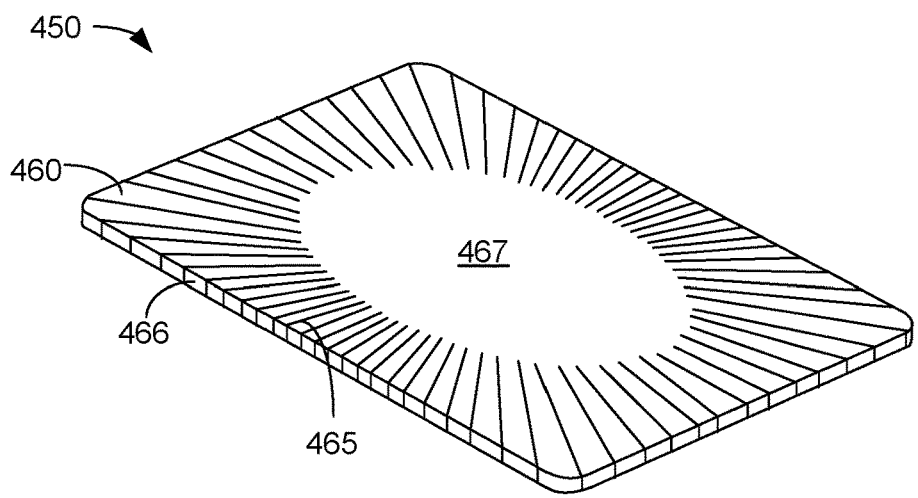
FIG. 4B is a diagram showing a circumferentially apertured metal layer of FIG. 3A or FIG. 3B in accordance with an exemplary embodiment of the disclosure.

FIG. 4B is a diagram 450 showing a circumferentially apertured metal layer of FIG. 3A or FIG. 3B in accordance with an exemplary embodiment of the disclosure. The metal layer 460 may include circumferential apertures 465. In an exemplary embodiment, the circumferential apertures 465 extend completely through a thickness of the metal layer 460 from a periphery 466 along the circumference of the metal layer 460 inward toward a central area 467 of the metal layer 460. In an exemplary embodiment, the circumferential apertures 465 are arranged in a two-dimensional array. In an exemplary embodiment, two or more of the circumferential apertures 465 may be parallel to each other and may be of differing lengths and/or widths, and/or spacings, and may occur at a frequency other than do the apertures 435 of FIG. 4A. For example, the spacing between circumferential apertures 465 may be different than the spacing between circumferential apertures 435 such that there may be twice as many circumferential apertures 465 as there are circumferential apertures 435 (FIG. 4A). Other numbers of circumferential apertures and varied spacing between the circumferential apertures are also possible. In an exemplary embodiment, the circumferential apertures 465 each begin at an outer periphery 466 of the metal layer 460 and terminate toward the area 467 in the central portion of the metal layer 460. In an exemplary embodiment, the circumferential apertures 465 do not extend substantially completely across the metal layer 460, thus allowing the metal layer 460 to retain mechanical stability while also allowing the metal layer 460 to flex. In an exemplary embodiment, the circumferential apertures 465 reduce the rigidity of the metal layer 460 and allow the metal layer 460 to flex, and a smart card having the metal layer 460, to easily bend in one, two or three dimensions and to conform to a shape other than flat. For example, a smart card having the metal layer 460 may fit inside a wallet and can flex to take on the shape of the wallet, thus making a smart card having the metal layer 460 flexible. Terminating the circumferential apertures 465 toward the central area 467 in the approximate central portion of the metal layer 460 provides the above-mentioned flexibility while maintaining the mechanical stability of the metal layer 460. In an exemplary embodiment, an amount of flexibility of the metal layer 460 can be controlled by selecting the dimensions of the circumferential apertures 465.

Figure 4C:
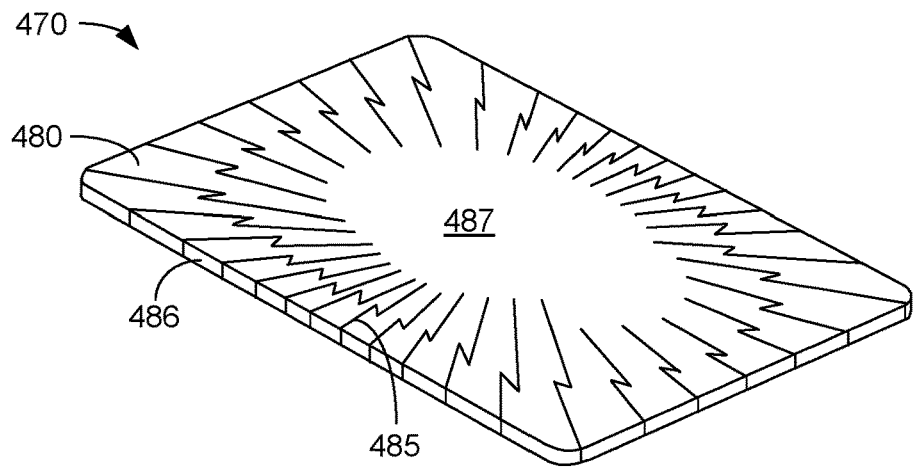
FIG. 4C is a diagram showing a circumferentially apertured metal layer of FIG. 3A or FIG. 3B in accordance with an exemplary embodiment of the disclosure.

FIG. 4C is a diagram 470 showing a circumferentially apertured metal layer of FIG. 3A or FIG. 3B in accordance with an exemplary embodiment of the disclosure. The metal layer 480 may include circumferential apertures 485. In an exemplary embodiment, the circumferential apertures 485 extend completely through a thickness of the metal layer 480 from a periphery 486 along the circumference of the metal layer 480 inward toward a central area 487 of the metal layer 480. In an exemplary embodiment, the circumferential apertures 485 may be formed to have a shape other than substantially straight. For example, the circumferential apertures 485 may exhibit a serrated or sawtooth shape as shown in FIG. 4C. In an exemplary embodiment, the serrated or sawtooth shape of the circumferential apertures 485 shown in FIG. 4C create more discontinuities than do the circumferential apertures 435 shown in FIG. 4A or the circumferential apertures 465 shown in FIG. 4B. In an exemplary embodiment, the circumferential apertures 485 may further reduce the rigidity of the metal layer 480 beyond that of the metal layer 430 (FIG. 4A) or metal layer 460 (FIG. 4B), and accordingly, further reduce a rigidity of a smart card having the metal layer 480. In an exemplary embodiment, the serrated or sawtooth shape of the circumferential apertures 485 may also create additional open area to allow adhesive to flow between a top poly layer 340 (FIG. 3A) and a bottom poly layer 310 (FIG. 3A) to increase bonding strength between the poly layers along an outer edge of a smart card having the circumferentially apertured metal layer 480. In an alternative exemplary embodiment in which a smart card is manufactured using a hot lamination process to bond the top poly layer 340 (FIG. 3A) to the bottom poly layer 310 (FIG. 3A), the additional open area created by the circumferential apertures 485 may allow additional material of the top poly layer 340 (FIG. 3A) and the bottom poly layer 310 (FIG. 3A) to flow to increase bonding strength along an outer edge of a smart card having the metal layer 480.

Figure 12A:
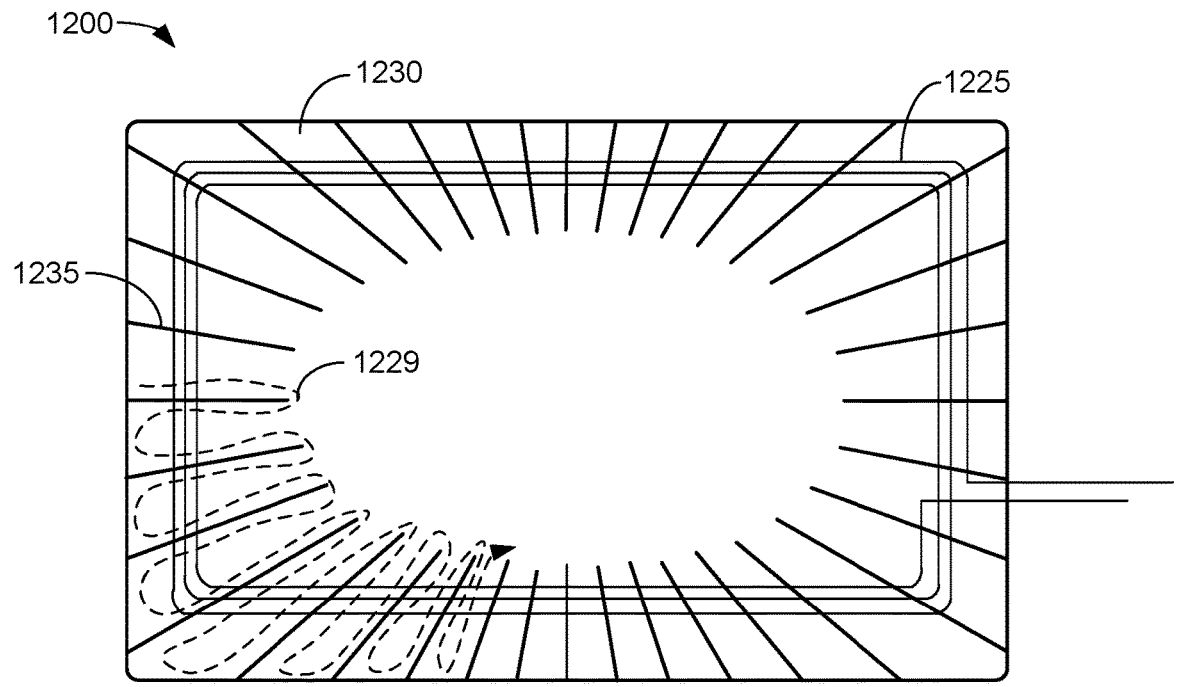
FIG. 12A is a diagram showing eddy current flow in a circumferentially apertured metal layer in accordance with an exemplary embodiment of the disclosure.
Figure 12B:
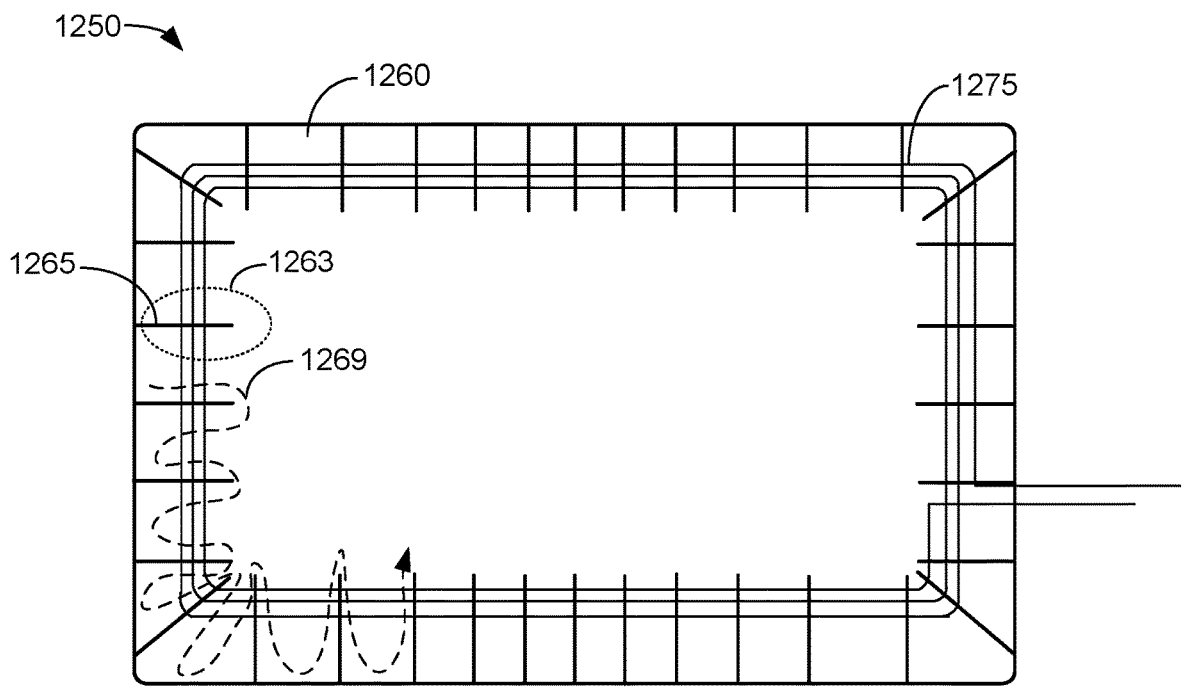
FIG. 12B is a diagram showing eddy current flow in a circumferentially apertured metal layer in accordance with an exemplary embodiment of the disclosure.

In an exemplary embodiment, the circumferential apertures 485 are arranged in a two-dimensional array. In an exemplary embodiment, two or more of the circumferential apertures 485 may be substantially parallel to each other and may be of differing lengths and/or widths, and may occur at the frequency shown in FIG. 4C or at different frequencies than that shown in FIG. 4C. In an exemplary embodiment, the circumferential apertures 485 each begin at an outer periphery 486 of the metal layer 480 and terminate toward the area 487 in the central portion of the metal layer 480. In an exemplary embodiment, the circumferential apertures 485 do not extend substantially completely across the metal layer 480, thus allowing the metal layer 480 to retain mechanical stability while also allowing the metal layer 480 to flex. In an exemplary embodiment, the circumferential apertures 485 reduce the rigidity of the metal layer 480 and allow the metal layer 480 to flex, and a smart card having the metal layer 480, to easily bend in one, two or three dimensions and to conform to a shape other than flat. For example, a smart card having the metal layer 480 may fit inside a wallet and can flex to take on the shape of the wallet, thus making a smart card having the metal layer 480 flexible. Terminating the circumferential apertures 485 toward the central area 487 in the approximate central portion of the metal layer 480 provides the above-mentioned flexibility while maintaining the mechanical stability of the metal layer 480. In an exemplary embodiment, an amount of flexibility of the metal layer 480 can be controlled by selecting the dimensions of the circumferential apertures 485. The additional sawtooth or serrated features of circumferential apertures 485 may also serve to further disrupt an eddy current path, such as those that are shown in FIG. 12A and FIG. 12B.

Figure 5A:
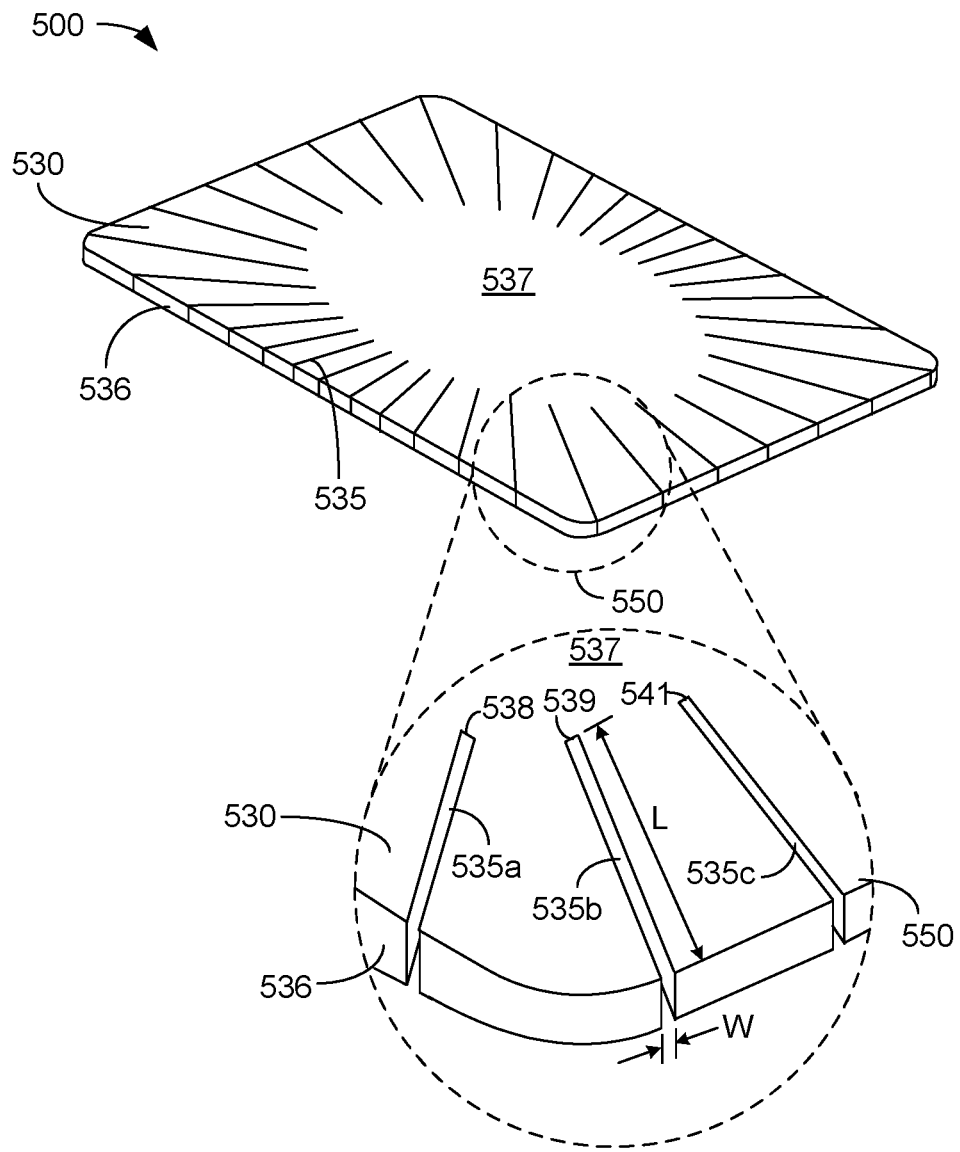
FIG. 5A is a drawing showing additional detail of the circumferentially apertured metal layer of FIG. 4A.

FIG. 5A is a drawing 500 showing additional detail of the circumferentially apertured metal layer 430 of FIG. 4A. In an exemplary embodiment, the metal layer 530 includes circumferential apertures 535 that extend from a periphery 536 of the metal layer 530 along the circumference inward toward an interior portion or central area 537 of the metal layer 530. As shown in the inset 550, each circumferential aperture 535 is a complete opening through the thickness of the metal layer 530 extending from the periphery 536 of the metal layer 530 toward the central area 537 of the metal layer 530. For example, in an exemplary embodiment a circumferential aperture 535*a* is a through cut that extends from a periphery 536 to a location 538 on the metal layer 530, the circumferential aperture 535*b* is a through cut that extends from a periphery 536 to a location 539 on the metal layer 530, and the circumferential aperture 535*c* is a through cut that extends from a periphery 536 to a location 541 on the metal layer 530. Although not individually numbered, all circumferential apertures 535 in the metal layer 530 may be similarly formed. Although shown as being a straight or linear aperture in FIG. 5A, the circumferential apertures 535*a*, 535*b* and 535*c* may have profiles other than straight, such as the serrated or sawtooth profile shown in FIG. 4C. Other shapes and profiles of the circumferential apertures 535 are also possible, such as curved, meandering, etc.

In an exemplary embodiment, an amount of flexibility of the metal layer 530 can be controlled by selecting the dimensions of the circumferential apertures 535. For example, selecting the length "L" and the width "W" of the circumferential apertures 535 (with circumferential aperture 535*b* shown as an example), can determine the rigidity and flexibility of the metal layer 530 and a smart card having the metal layer 530. For example, larger dimensions for L and W for the circumferential apertures 535 may provide greater flexibility than smaller dimensions for L and W for the circumferential apertures 535. Further, the circumferential apertures 535 may have different dimensions. For example, the dimensions for L and W for the circumferential aperture 535*a* may be the same or different than the dimensions for L and W for the circumferential aperture 535*b*. Additionally the spacing between the apertures 535*a*, 535*b* and 535*c* (and all circumferential apertures 535 on the metal layer 530) may be varied to result in a particular desired stiffness.

Figure 5B:
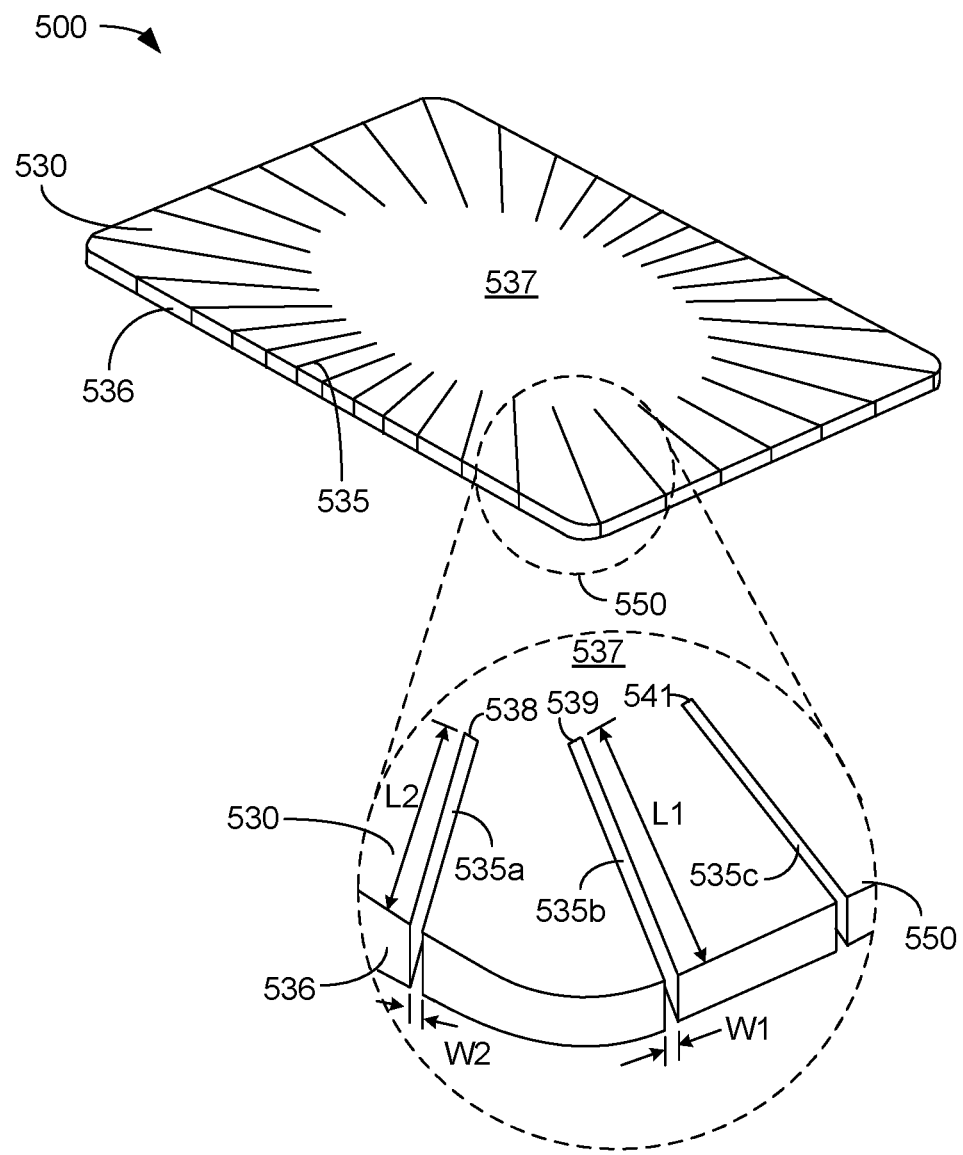
FIG. 5B is a drawing showing additional detail of an alternative exemplary embodiment of the circumferentially apertured metal layer of FIG. 4A.

FIG. 5B is a drawing showing additional detail of an alternative exemplary embodiment of the circumferentially apertured metal layer of FIG. 4A. In the example shown in FIG. 5B, the circumferential aperture 535*b* has dimensions L1 and W1, and the circumferential aperture 535*a* has dimensions L2 and W2, where L1 is different than L2 and where W1 is different than W2.

Figure 6:
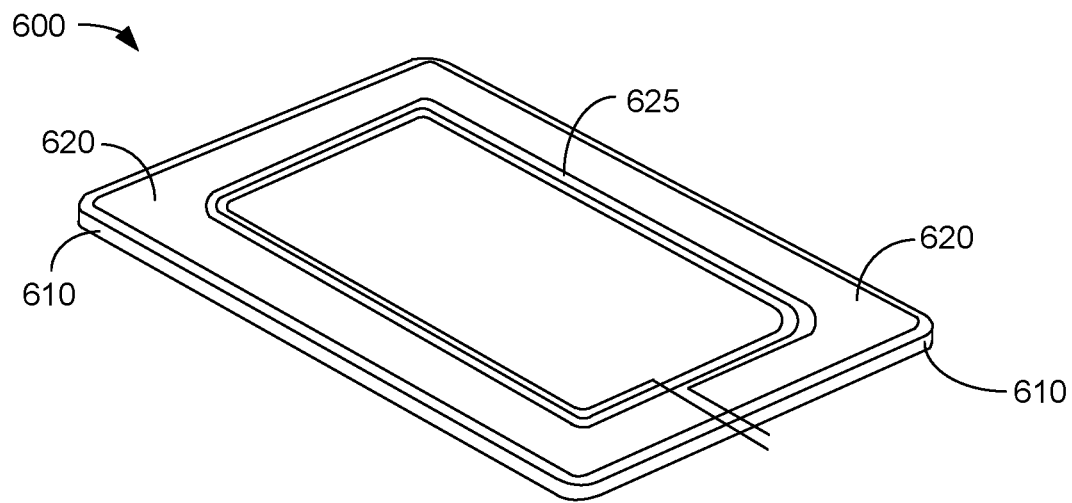
FIG. 6 is a drawing showing additional detail of the bottom poly layer, electrical substrate layer and antenna of FIG. 3A or FIG. 3B.

FIG. 6 is a drawing 600 showing additional detail of the bottom poly layer, electrical substrate layer and antenna of FIG. 3A or FIG. 3B. In an exemplary embodiment, an electrical substrate layer 620 may be located over a bottom poly layer 610. The electrical substrate layer 620 may be bonded to the bottom poly layer 610 using an adhesive (not shown), or the electrical substrate layer 620 may be otherwise held in place in relation to the bottom poly layer 610 in other ways. For example, the electrical substrate layer 620 may be held in place in relation to the bottom poly layer 610 when a smart card is assembled. For example, a top poly layer (not shown in FIG. 6) may be hot laminated to the bottom poly layer 610, thereby holding the electrical substrate layer 620 in place. In an exemplary embodiment, an antenna 625 may be located on the electrical substrate layer 620 along with other electrical contacts and circuitry (not shown). The antenna 625 may also be a separate loop of wire separately connected to the electrical substrate layer 620, or the antenna 625 may be fabricated on a separate substrate or layer and located adjacent to the electrical substrate layer 620.

Figure 7:
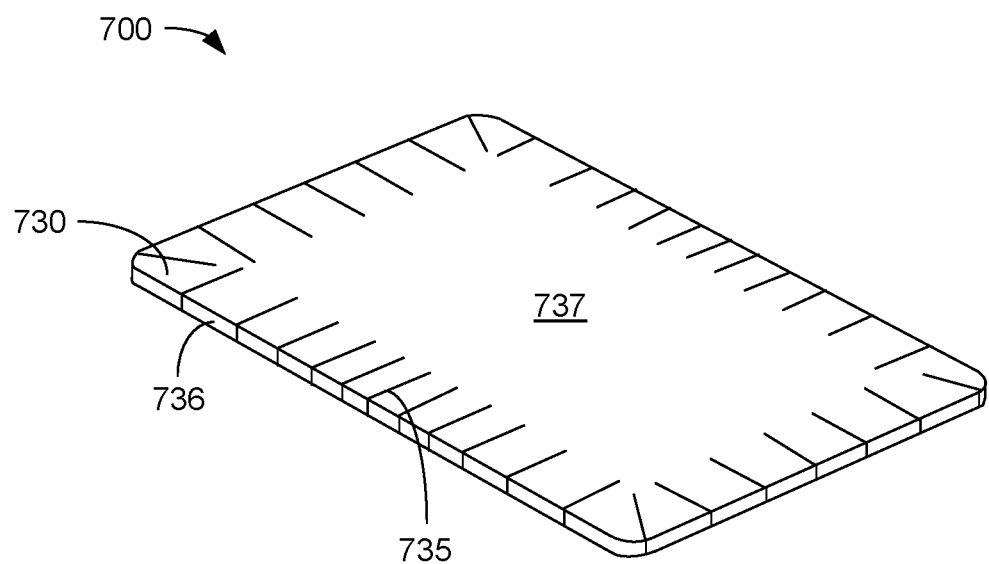
FIG. 7 is a diagram showing an alternative exemplary embodiment of a circumferentially apertured metal layer of FIG. 3A or FIG. 3B in accordance with an exemplary embodiment of the disclosure.

FIG. 7 is a diagram 700 showing an alternative exemplary embodiment of a circumferentially apertured metal layer of FIG. 3A or FIG. 3B in accordance with an exemplary embodiment of the disclosure. The metal layer 730 may include circumferential apertures 735. In an exemplary embodiment, the circumferential apertures 735 are arranged in a two-dimensional array. In an exemplary embodiment, the circumferential apertures 735 extend from a periphery 736 along the circumference of the metal layer 730 inward toward an interior portion or central area 737 of the metal layer 730. In an exemplary embodiment, one or more of the circumferential apertures 735 may be parallel to each other and one or more of the circumferential apertures 735 may be non-parallel to other circumferential apertures and may be of the same or differing lengths and/or widths and/or spacings. In the exemplary embodiment shown in FIG. 7, the circumferential apertures 735 are substantially the same length and width. In other embodiments, one or more of the circumferential apertures 735 may not be parallel and may be the same or differing lengths and/or widths. In an exemplary embodiment, the circumferential apertures 735 each begin at an outer periphery of the metal layer 730 and terminate toward the central area 737 of the metal layer 730. In an exemplary embodiment, the circumferential apertures 735 extend completely through the thickness of the metal layer 730, but do not extend completely across the metal layer 730. In an exemplary embodiment, the circumferential apertures 735 reduce the rigidity of the metal layer 730 and increase the flexibility of the metal layer 730. The circumferential apertures 735 allow the metal layer 730, and a smart card having the metal layer 730, to easily bend and conform to a shape other than flat. For example, a smart card having the metal layer 730 may fit inside a wallet and can flex to take on the shape of the wallet, thus making a smart card having the metal layer 730 flexible. Terminating the circumferential apertures 735 toward the central area 737 in the approximate central portion of the metal layer 730 provides the above-mentioned flexibility while maintaining the mechanical stability of the metal layer 730 and serve to disrupt eddy currents as shown below in FIG. 12A and FIG. 12B.

Figure 8:
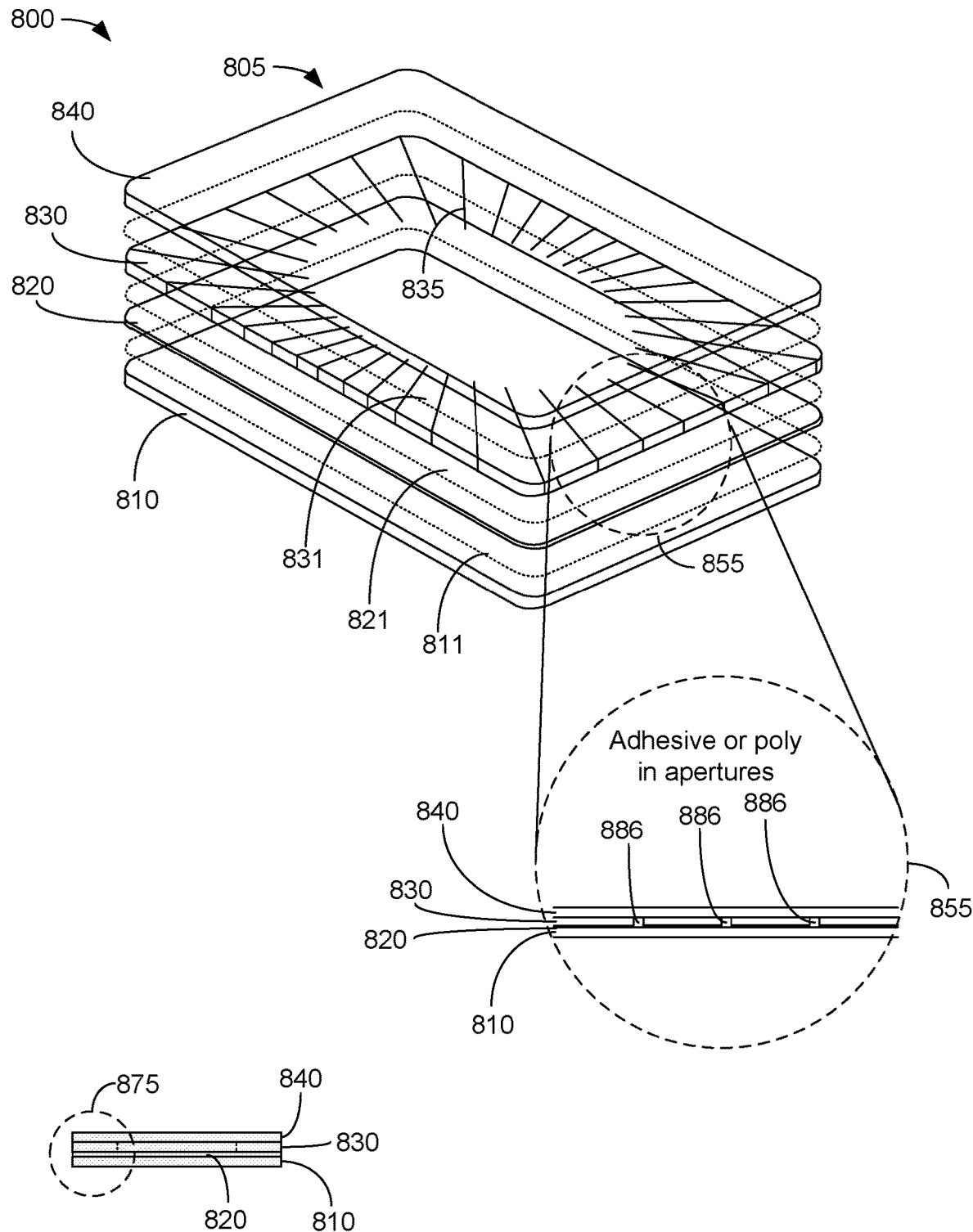
FIG. 8 is a diagram showing an exploded view of an exemplary embodiment of a smart card having a circumferentially apertured metal layer in accordance with an exemplary embodiment of the disclosure.

FIG. 8 is a diagram 800 showing an exploded view of an exemplary embodiment of a smart card 805 having a circumferentially apertured metal layer in accordance with an exemplary embodiment of the disclosure. The diagram 800 shows a smart card 805 having a bottom polymer (poly) layer 810, an electrical substrate layer 820, a metal layer 830 and a top poly layer 840. In some embodiments, there may be one or more adhesive layers located between one or more of the layers shown in FIG. 8. In the example shown in FIG. 8, an adhesive layer 811 is shown between the bottom poly layer 810 and the electrical substrate layer 820, an adhesive layer 821 is shown between the electrical substrate layer 820 and the metal layer 830, and an adhesive layer 831 is shown between the metal layer 830 and the top poly layer 840. The adhesive layers 811, 821 and 831 are shown in dotted line to indicate that they are optional and not always present in a smart card 805. In some embodiments, the top poly layer 840 and the bottom poly layer 810 may be hot laminated together in some locations so that one or more separate adhesive layers may be eliminated.

In an exemplary embodiment, the metal layer 830 may comprise a number of apertures 835 formed through the thickness of the metal layer 830 around the circumference and extending from a periphery of the metal layer 830 inwards toward the center of the metal layer 830.

In an exemplary embodiment, there is a region 875 where an adhesive material located between the bottom poly layer 810 and the metal layer 830, and an adhesive material located between the metal layer 830 and the top poly layer 840 will flow through or occupy the open area created by the apertures 835. The inset 885 shows an edge of the smart card 805 where adhesive material (or hot laminated poly material from the bottom poly layer 810 and the top poly layer 840) occupies the aperture openings 886.

In an exemplary embodiment, the apertures 835 may provide "edges" for adhesive material adjacent to the metal layer 830 to contact and grab in a cold-laminated card manufacturing process. In an exemplary embodiment, the adhesive layers 811 and 831 that bond the top poly layer 840 and the bottom poly layer 810 need not completely fill the vertical openings 886 in the metal layer 830 to work.

In an exemplary embodiment, the adhesive would be bonded or anchored at each aperture edge and thus would help in resisting horizontal shear. This effect is much like roughing up a metal surface with a coarse abrasive to make a contacting layer adhere better. This would mitigate a current problem of the poly outer layer(s) delaminating or peeling back around the edges.

In an exemplary embodiment, a hot-laminating process can be used to bond the top poly layer 840 to the bottom poly layer 810 where material of the top poly layer 840 and bottom poly layer 810 would flow together under heat and pressure to form into a solid block, thus filling the openings 866 with the reflowed material from the top poly layer 840 and the bottom poly layer 810.

In this manner, the apertures 835 facilitate the bonding of the bottom poly layer 810 to the top poly layer 840 so that the edges of the smart card 805 can be secured.

Figure 9:
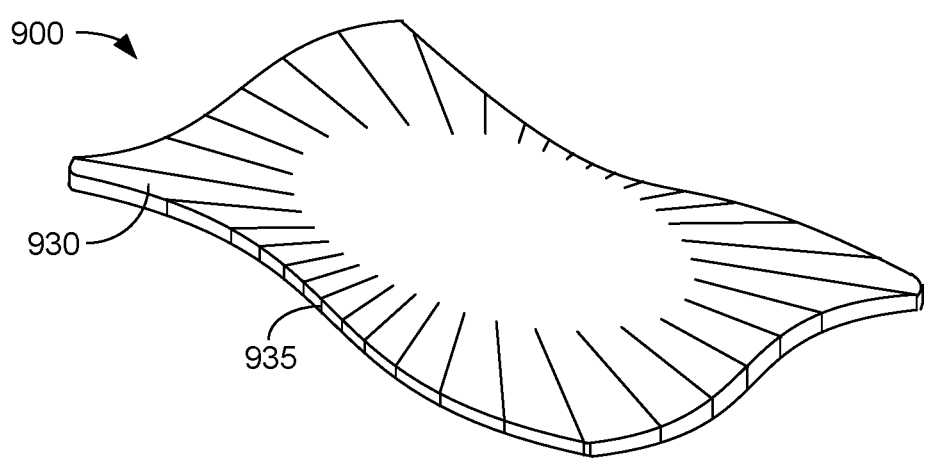
FIG. 9 is a diagram showing mechanical deformation of a circumferentially apertured metal layer in accordance with an exemplary embodiment of the disclosure.

FIG. 9 is a diagram 900 showing mechanical deformation of a circumferentially apertured metal layer 930 in accordance with an exemplary embodiment of the disclosure. In an exemplary embodiment, the circumferential apertures 935 allow the metal layer 930 to flex in one, two and/or three dimensions so that a smart card having the metal layer 930 can have a controlled amount of flexibility to optimize mechanical ergonomics of the smart card. For example, the number, length, width, and spacing of the circumferential apertures 935 may be selected to provide a determined amount of flexibility to optimize mechanical ergonomics of a smart card having the circumferentially apertured metal layer 930.

Figure 10:
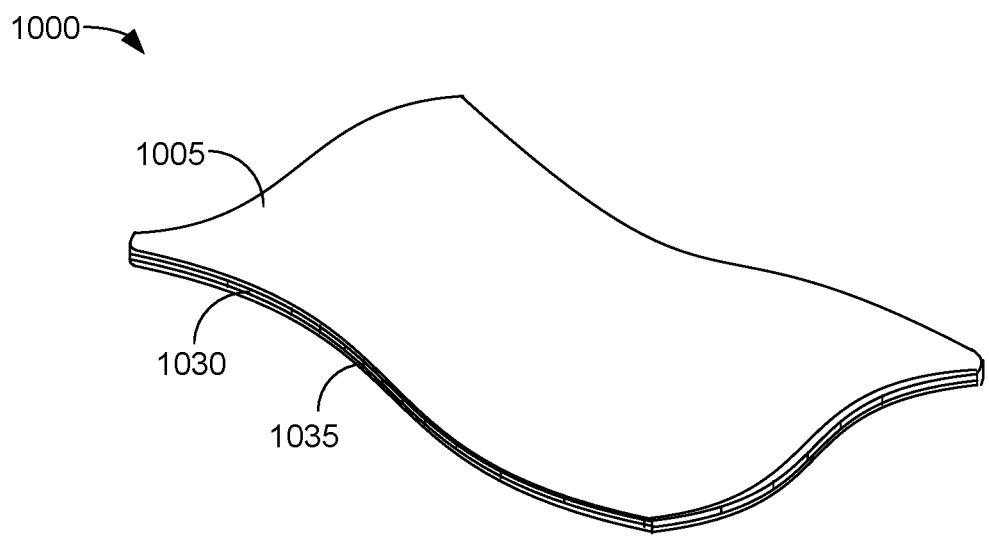
FIG. 10 is a diagram showing mechanical deformation of a biometric smart card having a continuous circumferentially apertured metal layer in accordance with an exemplary embodiment of the disclosure.

FIG. 10 is a diagram 1000 showing mechanical deformation of a biometric smart card 1005 having a continuous circumferentially apertured metal layer 1030 in accordance with an exemplary embodiment of the disclosure. In an exemplary embodiment, the apertures 1035 allow the metal layer 1030 to flex in one, two and/or three dimensions so that a smart card having the metal layer 1030 may be flexible.

Figure 11:
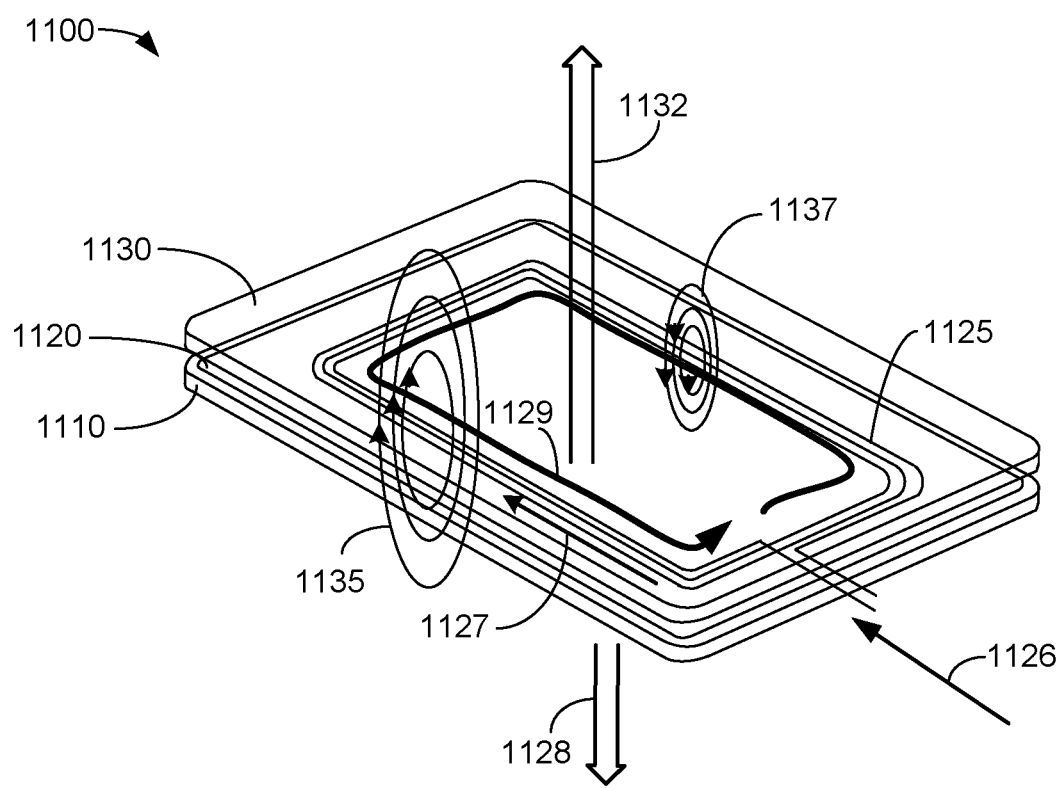
FIG. 11 is a diagram showing a metal layer having an induced eddy current.

FIG. 11 is a diagram 1100 showing a metal layer having an induced eddy current. A bottom poly layer 1110 may have an electrical substrate layer 1120 over or under which a metal layer 1130 may be located. The electrical substrate layer 1120 may have a loop antenna 1125. The coil formed by loop antenna 1125 has a current flow direction that may be indicated using the arrow 1126 and the arrow 1127. The coil current flow generates a primary or first magnetic field vector orthogonal to the current flow indicated using arrow 1128. The primary or first magnetic field vector indicated using the arrow 1128 may be referred to as a "B-field" where the primary or first magnetic B-field 1128 radiates outward and eventually back around the body of the coil shown using field lines 1135, where the strength of that field is proportional to the magnitude of the current that flows through the coil formed by the loop antenna 1125 according to Faraday's law.

The primary or first B-field 1128 that is generated by the loop antenna 1125 induces an eddy current in the direction opposite that of the current flow 1126 following the path shown using reference numeral 1129. This eddy current 1129 flows in the nearby conductive metal layer 1130 according to Faraday's and Lenz's laws of induction. An eddy current is a current which circulates in a conductor like swirling eddies in a stream. Eddy currents are induced by changing magnetic fields and flow in closed loops, perpendicular to the plane of the primary magnetic field. They can be created when a conductor is moving through a magnetic field, or when the magnetic field surrounding a stationary conductor is varying, i.e., anything which results in the conductor experiencing a change in the intensity or direction of a magnetic field can produce eddy currents. The size of the eddy current is typically proportional to the size of the magnetic field, the area of the loop and the rate of change of magnetic flux, and inversely proportional to the resistivity of the conductor.

The eddy current 1129 induced in the metal layer 1130 which flows in a direction opposite the flow of current in the antenna 1125 will generate a secondary or second magnetic field (B-field) according to Lenz's law as indicated using the arrow 1132 and shown using field lines 1137. Generally, the second magnetic field 1132 is weaker than the first magnetic field 1128, illustrated using the different relative dimensions of the field lines 1135 and the field lines 1137. This secondary magnetic field 1132 generally opposes and subtracts from the primary magnetic field 1128 and as a result, reduces the efficiency of a smart card having the antenna 1125 and its ability to harvest power wirelessly.

FIG. 12A is a diagram 1200 showing eddy current flow in a circumferentially apertured metal layer 1230 in accordance with an exemplary embodiment of the disclosure. The metal layer 1230 includes circumferential apertures 1235 as described above with respect to FIG. 4A. An antenna 1225 is shown as located over the metal layer 1230. The electrical substrate layer is omitted for clarity of illustration. The arrow 1229 represents a redirected eddy current flowing in the metal layer 1230. As a result of the circumferential apertures 1235, an eddy current flowing in the metal layer 1230 is forced to flow around a meandering path in the metal layer 1230 that follows the circumferential apertures 1235 as indicated using the arrow 1229, thus redirecting or disrupting the eddy current flow in the vicinity of the antenna 1225. The path of the current illustrated with reference numeral 1229 shows that a higher resistance is imparted to the eddy current as a result of the circumferential apertures 1235 forcing the eddy current to flow around the circumferential apertures 1235 than if the circumferential apertures 1235 were not present. The meandering path of the eddy current shown using reference numeral 1229 increases electrical resistance and reduces loop current due to the meandering path of the eddy current traversing more of the metal layer 1230 than there would be without the circumferential apertures 1235. This along with the changes in angular orientation of the eddy current flow back and forth from parallel to orthogonal with respect to the antenna 1225, serve to reduce the magnitude of the opposing secondary magnetic field and thus improves the efficiency of antenna 1225.

FIG. 12B is a diagram 1250 showing eddy current flow in a circumferentially apertured metal layer 1260 in accordance with an exemplary embodiment of the disclosure. The metal layer 1260 includes circumferential apertures 1265 as described above with respect to FIG. 7. An antenna 1275 is shown as located over the metal layer 1260. The electrical substrate layer is omitted for clarity of illustration. In the exemplary embodiment shown in FIG. 12B, a substantial number of the circumferential apertures 1650 are oriented substantially orthogonal to the path of the antenna 1275, as shown in the exemplary region 1263. Configuring the orientation of the circumferential apertures 1265 to be orthogonal relative to the orientation of the current flow in the coil formed by the antenna 1225, causes the secondary field 1132 (FIG. 11) generated by the eddy current path to be orthogonal to first field 1128 as previously shown in FIG. 11. According to Faraday's law, when the first and second fields are orthogonal to one another they do not interact and are independent of each other, and do not degrade the performance of antenna 1225.

A more detailed representation is shown by the arrow 1269, which depicts the redirected eddy current flowing in the metal layer 1260. As a result of the circumferential apertures 1265, an eddy current flowing in the metal layer 1260 is forced to flow around a meandering path that follows the circumferential apertures 1265 as indicated using the arrow 1269, thus redirecting and disrupting the eddy current flow in the vicinity of the antenna 1275. The meandering path with the addition of the substantially orthogonal orientation of the circumferential apertures 1265 in relation to the antenna 1275 further reduces the negating effect of the eddy current generated second magnetic field (B-field 1132, (FIG. 11) on the first magnetic field (B-field 1128, FIG. 11) generated by the antenna 1275 by redirecting and reducing the eddy current by increasing the total path resistance of the eddy current, and by disrupting the eddy current flow away from and substantially orthogonal to the antenna 1275.

Figure 13:
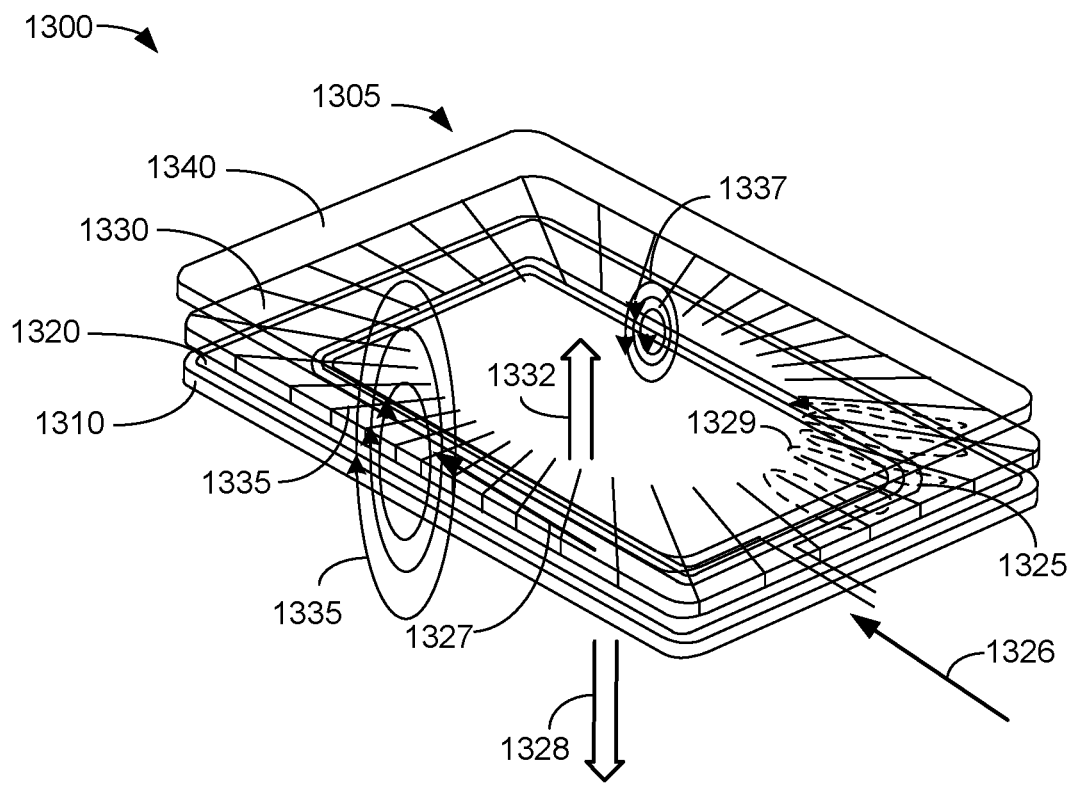
FIG. 13 is a diagram showing a smart card layer stack-up having a circumferentially apertured metal layer in accordance with an exemplary embodiment of the disclosure.

FIG. 13 is a diagram 1300 showing a smart card layer stack-up having a circumferentially apertured metal layer in accordance with an exemplary embodiment of the disclosure. The smart card 1305 includes a bottom poly layer 1310 over which an electrical substrate layer 1320 is located. A metal layer 1330 may be located over the electrical substrate layer 1320 and a top poly layer 1340 may be located over the metal layer 1330. The electrical substrate layer 1320 may have an antenna 1325. A coil current flow may be indicated using the arrow 1326 and the arrow 1327. The coil current flow generates a magnetic field indicated using arrow 1328 and shown using field lines 1335. The magnetic field indicated using the arrow 1328 may be referred to as a "B-field" where the magnetic B-field includes the total magnetic field including the magnetic field generated by the flow of current in the antenna 1325 and any contribution made by the magnetic properties of the material of the antenna 1325. In an exemplary embodiment, the magnetic field indicated using the arrow 1328 may be used to establish a wireless communication interface between the smart card 1305 and a wireless terminal.

As a result of the coil current flow, an eddy current indicated using the arrow 1329 may be induced in the metal layer 1330. Due to the presence of the apertures 1335 in the metal layer 1330, the eddy current induced in the metal layer 1330 will generally flow in a meandering path that follows the apertures 1335. In this manner, the eddy current flow indicated using arrow 1329 will generate a significantly smaller opposing magnetic field (B-field) indicated using the arrow 1332 and the field lines 1337 than the magnetic field (B-field) indicated using the arrow 1132 and field lines 1137 in FIG. 11 where the metal layer 1130 does not include the circumferential apertures 1335. The magnetic field 1332 still generally opposes the magnetic field 1228, but to a significantly lesser extent than the example shown in FIG. 11. The meandering path of the current 1329 reduces the effect of the eddy current 1329 on the magnetic field 1328 generated by the antenna 1325 by redirecting and disrupting the eddy current flow away from and substantially orthogonal to the antenna 1325. The addition of apertures 1335 in the metal layer 1330 both increase the mechanical flexibility of the smart card 1305 and also reduce the magnetic interference that could otherwise be caused by the secondary magnetic field indicated using the arrow 1332 on the primary magnetic field indicated by the arrow 1328.

Figure 14:
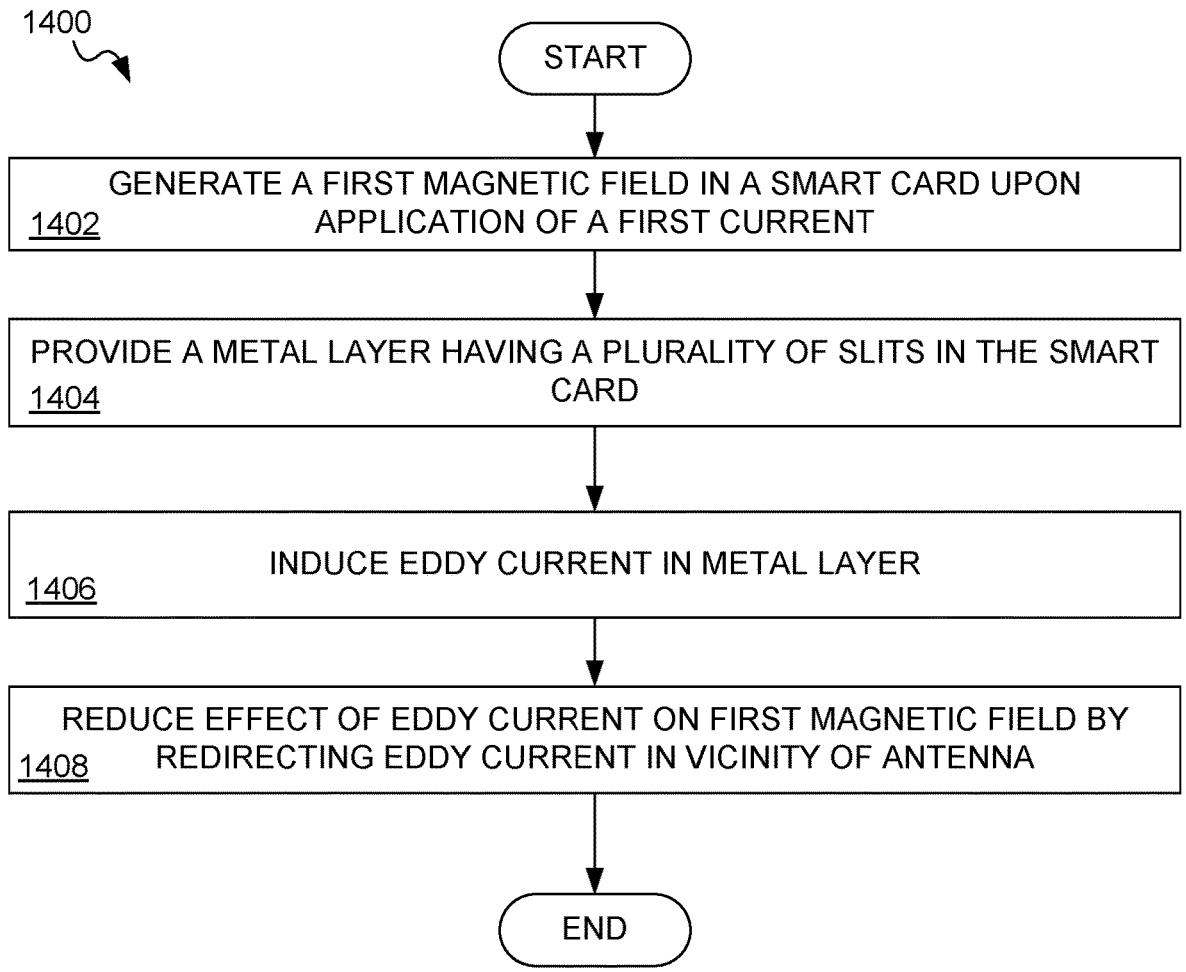
FIG. 14 is a flow chart describing an example of the operation of a method for mitigating an effect of eddy current in a biometric smart card.

FIG. 14 is a flow chart describing an example of the operation of a method 1400 for mitigating the effect of eddy currents in a smart card. The blocks in the method 1400 can be performed in or out of the order shown, and in some embodiments, can be performed at least in part in parallel.

In block 1402, a first magnetic field is generated in a smart card upon application of a first current. For example, a magnetic field (B-field) 1328 may be generated as a result of the current flow 1326 and 1327.

In block 1404, a metal layer having apertures is provided in a smart card. For example, the smart card 1305 includes a metal layer 1330 having apertures 1335.

In block 1406, an eddy current is induced in a metal layer. For example, an eddy current represented by the arrow 1329 may be induced in the metal layer 1330.

In block 1408, the effect of the eddy current on a first magnetic field is reduced by redirecting the eddy current in a vicinity of an antenna. For example, the effect of the eddy current represented by the arrow 1329 on a first magnetic field 1328 is reduced by redirecting the eddy current 1329 in the vicinity of the antenna 1325.

Figure 15:
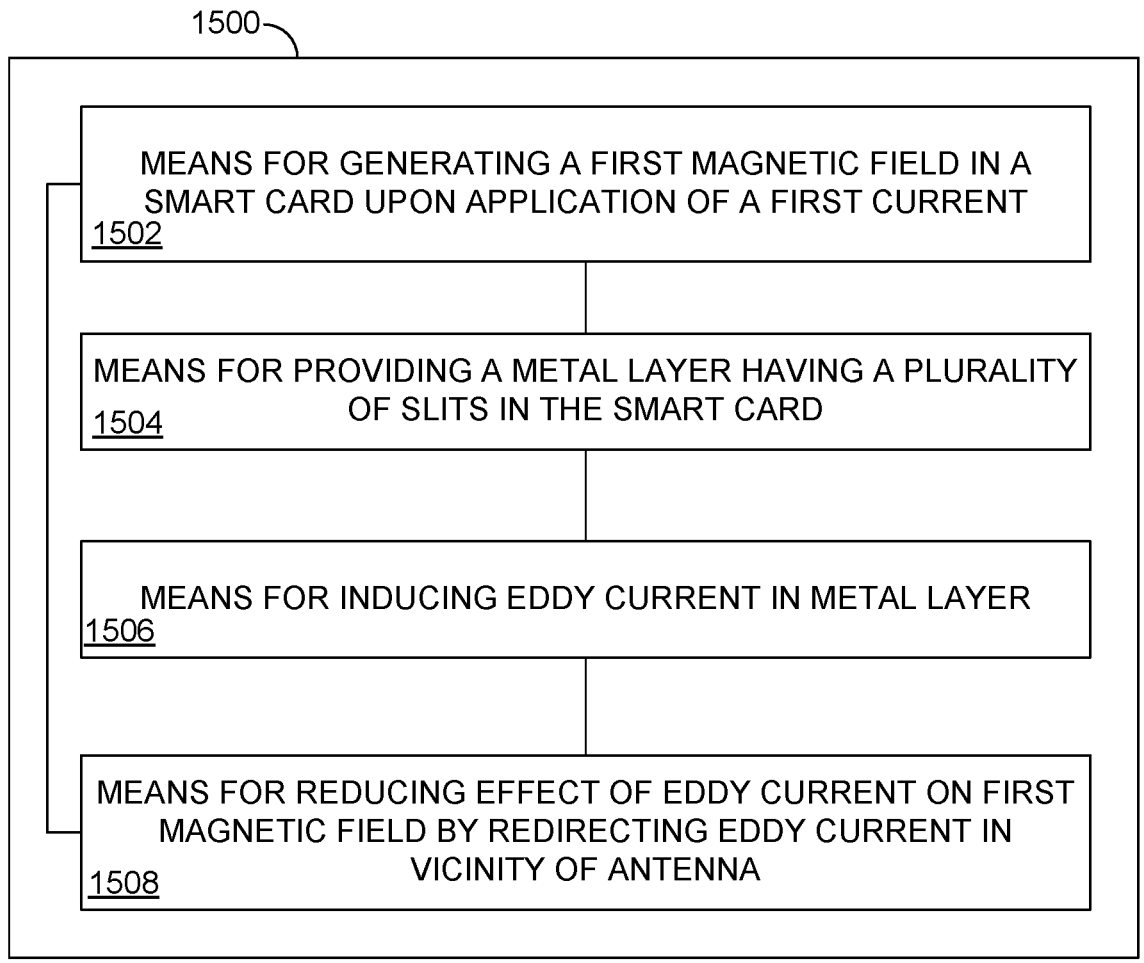
FIG. 15 is a functional block diagram of an apparatus for mitigating an effect of eddy current in a biometric smart card.

FIG. 15 is a functional block diagram of an apparatus 1500 for mitigating the effects of eddy currents in a smart card. In an exemplary embodiment, the apparatus 1500 comprises means 1502 for generating a first magnetic field in a smart card upon application of a first current. In certain embodiments, the means 1502 for generating a first magnetic field in a smart card upon application of a first current can be configured to perform one or more of the functions described in operation block 1402 of method 1400 (FIG. 14). In an exemplary embodiment, the means 1502 for generating a first magnetic field in a smart card upon application of a first current may comprise a magnetic field (B-field) 1328 being generated as a result of the current flow 1326 and 1327.

The apparatus 1500 also comprises means 1504 for providing a metal layer having apertures in a smart card. In certain embodiments, the means 1504 for providing a metal layer having apertures in a smart card can be configured to perform one or more of the functions described in operation block 1404 of method 1400 (FIG. 14). In an exemplary embodiment, the means 1504 for providing a metal layer having apertures in a smart card may comprise providing the smart card 1305 including a metal layer 1330 having apertures 1335.

The apparatus 1500 also comprises means 1506 for inducing an eddy current in a metal layer. In certain embodiments, the means 1506 for inducing an eddy current in a metal layer can be configured to perform one or more of the functions described in operation block 1406 of method 1400 (FIG. 14). In an exemplary embodiment, the means 1506 for inducing an eddy current in a metal layer may comprise an eddy current represented by the arrow 1329 being induced in the metal layer 1330.

The apparatus 1500 also comprises means 1508 for reducing the effect of the eddy current on a first magnetic field by redirecting the eddy current in a vicinity of an antenna. In certain embodiments, the means 1508 for reducing the effect of the eddy current on a first magnetic field by redirecting the eddy current in a vicinity of an antenna can be configured to perform one or more of the functions described in operation block 1408 of method 1400 (FIG. 14). In an exemplary embodiment, the means 1508 for reducing the effect of the eddy current on a first magnetic field by redirecting the eddy current in a vicinity of an antenna may comprise the effect of the eddy current represented by the arrow 1329 on a first magnetic field 1328 being reduced by redirecting the eddy current 1329 in the vicinity of the antenna 1325.

Implementation examples are described in the following numbered clauses:

1. A biometric smart card, comprising: a first polymer layer; an electrical substrate layer having at least one interconnect layer over the first polymer layer; an antenna proximate to the electrical substrate layer; a metal layer proximate to the antenna and the electrical substrate layer, the metal layer comprising a plurality of circumferential apertures; and a second polymer layer over the metal layer, wherein the plurality of apertures in the metal layer allow the smart card to flex in one, two or three dimensions.

2. The smart card of clause 1, wherein the circumferential apertures in the metal layer extend from a periphery of the metal layer to an interior portion of the metal layer.

3. The smart card of any of clauses 1 or 2, wherein the circumferential apertures in the metal layer extend completely through a thickness of the metal layer.

4. The smart card of any of clauses 1 through 3, wherein the circumferential apertures do not extend completely across a length or width of the metal layer.

5. The smart card of any of clauses 1 through 4, wherein the circumferential apertures are arranged in a two-dimensional array.

6. The smart card of any of clauses 1 through 5, wherein the circumferential apertures differ in one or more of length, width and spacing.

7. The smart card of any of clauses 1 through 5, wherein the circumferential apertures are the same length and width.

8. The smart card of any of clauses 1 through 7, wherein the circumferential apertures comprise a sawtooth profile.

9. The smart card of any of clauses 1 through 7, wherein the circumferential apertures are substantially orthogonal to the antenna.

10. The smart card of any of clauses 1 through 9, wherein the circumferential apertures are located so that an inner surface of the first polymer layer may contact an inner surface of the second polymer layer through the apertures.

11. The smart card of any of clauses 1 through 10, wherein the inner surface of the first polymer layer is bonded to the inner surface of the second polymer layer through the circumferential apertures.

12. The smart card of any of clauses 1 through 11, wherein the circumferential apertures redirect a flow of eddy current in the metal layer in a vicinity of the antenna.

13. The smart card of any of clauses 1 through 12, wherein redirecting the flow of eddy current in the metal layer in the vicinity of the antenna reduces a negating effect of a second magnetic field generated by the eddy current induced by the first magnetic field generated by the antenna.

14. A method for eddy current mitigation in a smart card, comprising: generating a first magnetic field in a smart card upon application of a first current; providing a metal layer in the smart card, the metal layer comprising a plurality of circumferential apertures; inducing an eddy current in the metal layer, the eddy current resulting in a second magnetic field that opposes the first magnetic field; and wherein the plurality of circumferential apertures in the metal layer reduces a negating effect of the second magnetic field on the first magnetic field by redirecting a flow of the eddy current in a vicinity of the antenna.

15. The method of clause 14, wherein redirecting the flow of the eddy current in the vicinity of the antenna diminishes a negating effect of the second magnetic field on the first magnetic field.

16. The method of any of clauses 14 or 15, wherein the first magnetic field is used to establish a wireless communication interface.

17. A device for eddy current mitigation in a smart card, comprising: means for generating a first magnetic field in a smart card upon application of a first current; means for providing a metal layer in the smart card, the metal layer comprising a plurality of circumferential apertures; means for inducing an eddy current in the metal layer, the eddy current resulting in a second magnetic field that opposes the first magnetic field; and means for reducing an effect of the second magnetic field on the first magnetic field by redirecting a flow of the eddy current in a vicinity of the antenna.

18. The device of clause 17, wherein the means for redirecting the flow of the eddy current in the vicinity of the antenna comprises means for diminishing a negating effect of the second magnetic field on the first magnetic field.

19. The device of any of clauses 17 or 18, wherein the first magnetic field is used to establish a wireless communication interface.

One or more illustrative or exemplary embodiments of the invention have been described above. However, it is to be understood that the invention is defined by the appended claims and is not limited to the specific embodiments described.

What is claimed is:

1. A biometric smart card, comprising:
a first polymer layer;
an electrical substrate layer having at least one interconnect layer over the first polymer layer;
an antenna proximate to the electrical substrate layer;
a metal layer proximate to the antenna and the electrical substrate layer, the metal layer comprising a plurality of circumferential apertures extending from a periphery of the smart card toward an interior central portion of the smart card; and
a second polymer layer over the metal layer, wherein the plurality of circumferential apertures in the metal layer allow the smart card to flex in one, two or three dimensions.

2. The smart card of claim 1, wherein the circumferential apertures in the metal layer extend completely through a thickness of the metal layer.

3. The smart card of claim 1, wherein the circumferential apertures do not extend completely across a length or width of the metal layer.

4. The smart card of claim 1, wherein the circumferential apertures are arranged in a two-dimensional array.

5. The smart card of claim 1, wherein the circumferential apertures differ in one or more of length, width and spacing.

6. The smart card of claim 1, wherein the circumferential apertures are the same length and width.

7. The smart card of claim 1, wherein the circumferential apertures comprise a sawtooth profile.

8. The smart card of claim 1, wherein the circumferential apertures are substantially orthogonal to the antenna.

9. The smart card of claim 1, wherein the circumferential apertures are located so that an inner surface of the first polymer layer may contact an inner surface of the second polymer layer through the apertures.

10. The smart card of claim 9, wherein the inner surface of the first polymer layer is bonded to the inner surface of the second polymer layer through the circumferential apertures.

11. The smart card of claim 1, wherein the circumferential apertures redirect a flow of eddy current in the metal layer in a vicinity of the antenna.

12. The smart card of claim 11, wherein redirecting the flow of eddy current in the metal layer in the vicinity of the antenna reduces a negating effect of a second magnetic field generated by the eddy current induced by the first magnetic field generated by the antenna.

13. A method for eddy current mitigation in a smart card, comprising:
generating a first magnetic field in a smart card upon application of a first current;
providing a metal layer in the smart card, the metal layer comprising a plurality of circumferential apertures extending from a periphery of the smart card toward an interior central portion of the smart card;
inducing an eddy current in the metal layer, the eddy current resulting in a second magnetic field that opposes the first magnetic field; and
wherein the plurality of circumferential apertures in the metal layer reduces a negating effect of the second magnetic field on the first magnetic field by redirecting a flow of the eddy current in a vicinity of the antenna.

14. The method of claim 13, wherein redirecting the flow of the eddy current in the vicinity of the antenna diminishes a negating effect of the second magnetic field on the first magnetic field.

15. The method of claim 13, wherein the first magnetic field is used to establish a wireless communication interface.

16. A device for eddy current mitigation in a smart card, comprising:
means for generating a first magnetic field in a smart card upon application of a first current;
means for providing a metal layer in the smart card, the metal layer comprising a plurality of circumferential apertures extending from a periphery of the smart card toward an interior central portion of the smart card;
means for inducing an eddy current in the metal layer, the eddy current resulting in a second magnetic field that opposes the first magnetic field; and
means for reducing an effect of the second magnetic field on the first magnetic field by redirecting a flow of the eddy current in a vicinity of the antenna.

17. The device of claim 16, wherein the means for redirecting the flow of the eddy current in the vicinity of the antenna comprises means for diminishing a negating effect of the second magnetic field on the first magnetic field.

18. The device of claim 16, wherein the first magnetic field is used to establish a wireless communication interface.

* * * * *